(12) United States Patent
Marzorati et al.

(10) Patent No.: US 12,190,141 B2
(45) Date of Patent: Jan. 7, 2025

(54) COMPUTING ENVIRONMENT PREDICTIVE PROVISIONING

(71) Applicant: KYNDRYL, INC., New York, NY (US)

(72) Inventors: Mauro Marzorati, Lutz, FL (US); Todd Russell Whitman, Bethany, CT (US); Jeremy R. Fox, Georgetown, TX (US); Michael Bender, Rye Brook, NY (US); Sarbajit K. Rakshit, Kolkata, (IN)

(73) Assignee: Kyndryl, Inc., New York, NY (US)

( * ) Notice: Subject to any disclaimer, the term of this patent is extended or adjusted under 35 U.S.C. 154(b) by 485 days.

(21) Appl. No.: 17/581,726

(22) Filed: Jan. 21, 2022

(65) Prior Publication Data

US 2023/0236871 A1     Jul. 27, 2023

(51) Int. Cl.
  *G06F 3/00*     (2006.01)
  *G06F 9/46*     (2006.01)
  *G06F 30/27*    (2020.01)

(52) U.S. Cl.
  CPC ............... *G06F 9/46* (2013.01); *G06F 30/27* (2020.01)

(58) Field of Classification Search
  CPC ........................................................ G06F 9/48
  See application file for complete search history.

(56) References Cited

U.S. PATENT DOCUMENTS

| | | |
|---|---|---|
| 10,637,142 B1 | 4/2020 | Tran et al. |
| 10,805,179 B2 | 10/2020 | Guim Bernat et al. |
| 11,456,926 B1* | 9/2022 | Mermoud ........... H04L 41/5067 |
| 2018/0276038 A1* | 9/2018 | Malik .................... G06F 9/5077 |
| 2018/0336494 A1* | 11/2018 | Wagstaff ............ G05B 13/0265 |
| 2018/0359648 A1* | 12/2018 | Savalle .................... H04L 45/48 |
| 2019/0044831 A1* | 2/2019 | Guim Bernat .......... H04L 67/61 |
| 2019/0110185 A1* | 4/2019 | Kolar ...................... G06N 20/20 |
| 2019/0197693 A1* | 6/2019 | Zagaynov ............. G06V 30/412 |
| 2019/0303799 A1* | 10/2019 | Gottin .................... G06N 20/20 |
| 2020/0195506 A1* | 6/2020 | Peng ...................... H04W 24/10 |
| 2020/0252682 A1* | 8/2020 | Walker ................. H04N 21/251 |
| 2020/0342346 A1* | 10/2020 | Wulff .................. H04L 12/4633 |
| 2020/0379839 A1* | 12/2020 | Savalle ............... H04L 12/4633 |
| 2020/0389390 A1* | 12/2020 | Vasseur ................. G06N 20/00 |

(Continued)

OTHER PUBLICATIONS

Tiantian Xu, A Hybrid Machine Learning Model for Demand Prediction of Edge-Computing-Based Bike-Sharing System Using Internet of Things. (Year: 2020).*

(Continued)

*Primary Examiner* — Lechi Truong
(74) *Attorney, Agent, or Firm* — CANTOR COLBURN LLP; Erik Swanson

(57) ABSTRACT

Methods, computer program products, and systems are presented. The method computer program products, and systems can include, for instance: iteratively obtaining utilization parameter values from first to Nth edge computing environments, training one or more predictive model by machine learning using parameter values of the utilization parameter values obtained by the iteratively obtaining, wherein the training includes training a first computing environment predictive model with use of parameter values of the utilization parameters obtained from the first computing environment by the iteratively obtaining.

19 Claims, 15 Drawing Sheets

(56) References Cited

U.S. PATENT DOCUMENTS

| | | | |
|---|---|---|---|
| 2021/0110293 A1* | 4/2021 | Lehr | G06N 5/01 |
| 2021/0136178 A1* | 5/2021 | Casey | G06F 9/5077 |
| 2021/0144517 A1 | 5/2021 | Guim Bernat et al. | |
| 2021/0256485 A1* | 8/2021 | Fidanza | G06Q 30/0201 |
| 2021/0258349 A1* | 8/2021 | Crabtree | G06F 16/951 |
| 2022/0269936 A1* | 8/2022 | Zhu | G06N 3/04 |
| 2022/0360567 A1* | 11/2022 | Vasseur | H04L 63/166 |
| 2023/0168992 A1* | 6/2023 | Koch | H04L 41/5009 |
| | | | 717/124 |

OTHER PUBLICATIONS

Ekaterina Aleksandrova, Machine Learning Model Updates in Edge Computing: An Optimal Stopping Theory Approach. (Year: 2019).*
"Deriving SLA for Composite Web Services with Multiple Implementation Options", IPCOM000175762FD, Oct. 23, 2008, 14 pgs.
"Dynamic Service-Level-Agreement Aware Automatic Microscaling for Application Servers on Multitenant Systems", IPCOM000254020D, May 25, 2018, 7 pgs.
"Context aware priority-based object recognition, tracking, analyzing in edge computing ecosystem", IPCOM000262496D; Jun. 7, 2020, 5 pgs.
Li, Y., et al., "End-to-End Service Level Agreement Specification for IOT Applications", Oct. 13, 2018, 11 pgs.
Chraibi, M. et al., "Policy Based Context Aware Service Level Agreement (SLA) Management in the Cloud", Cloud Computing 2017: The Eighth International Conference on Cloud Computing, GRIDs, and Virtualization, pp. 122-128.
Aral, A., et al., "Dependency Mining for Service Resilience at the Edge", 2018, 15 pgs.
Mell, P., et al., "The NIST Definition of Cloud Computing", NIST Special Publication 800-145, Sep. 2011, Gaithersburg, MD, 7 pgs.
Chima, R., "The Benefits of Edge Computing", The Blueberry Insights Blog, May 15, 2019, 5 pgs. Retrieved on Oct. 25, 2021 from the Internet URL: bbconsult.co.uk/blog/cdgc-computing.
Overby, S., et al., "What is an SLA? Best practices for service-level agreements", CIO, Jul. 5, 2017, 13 pgs. Retrieved on Oct. 25, 2021 from the Internet URL: cio.com/article/274740/outsourcing-sla-definitions-and-solutions.html.
Skelton, M., "5 ways site reliability engineering transforms IT Ops", TechBeacon, 7 pgs. Retrieved on Oct. 25, 2021 from the Internet URL: https://techbeacon.com/enterprise-it/5-ways-site-reliability-engineering-transforms-it-ops.
Shaw, K., et al., "What is a digital twin and why it's important to IoT", Network World, Jan. 21, 2019, 5 pgs. Retrieved on Oct. 25, 2021 from the Internet URL: networkworld.com/article/3280225/what-is-digital-twin-technology-and-why-it-matters.html.
Immerman, D., "The Evolution of Digital Twin—and How Emerging Tech Is Driving Adoption", Mar. 14, 2019, 4 pgs. Retrieved on Oct. 25, 2021 from the Internet URL: ptc.com/en/product-lifecycle-report/digital-twin-technologies-driving-adoption.
Al-Ghuwairi, A., et al., "Modeling and Enforcement of Cloud Computing Service Level Agreements", 9 pgs. Retrieved on Oct. 25, 2021 from the Internet URL: cs.nmsu.edu/please/papers/tr-cloud-2012.pdf.
Lu, K., et al., "QoS-Aware VM Placement in Multi-Domain Service Level Agreements Scenarios", 8 pgs. Retrieved on Oct. 25, 2021 from the Internet URL: user.gwdg.de/~klu/QoS-Aware%20VM%20Placement%20in%20Multi-Domain%20Service%20Level%.
"Site Reliability Engineering", SRE@IBM, 2 pgs. Retrieved on Dec. 23, 2021 from the Internet URL: https://w3.ibm.com/w3publisher/sre-ibm.

* cited by examiner

COMPUTING ENVIRONMENT PREDICTIVE PROVISIONING

BACKGROUND

Embodiments herein relate generally to provisioning a computing environment and specifically to predictively provisioning a computing environment.

A network service can include a software application running at the network software application layer and above that provides data storage, manipulation, presentation, communication or other capability which is often implemented using a client-server architecture based on software application layer network protocols. Each network service is usually provided by a server component running on one or more computer and accessed via a network by client components running on other devices. However, client and server components may both run on the same machine. In addition, a dedicated server computer may offer multiple network services concurrently.

Data structures have been employed for improving operation of computer system. A data structure refers to an organization of data in a computer environment for improved computer system operation. Data structure types include containers, lists, stacks, queues, tables and graphs. Data structures have been employed for improved computer system operation e.g., in terms of algorithm efficiency, memory usage efficiency, maintainability, and reliability.

Artificial intelligence (AI) refers to intelligence exhibited by machines. Artificial intelligence (AI) research includes search and mathematical optimization, neural networks and probability. Artificial intelligence (AI) solutions involve features derived from research in a variety of different science and technology disciplines ranging from computer science, mathematics, psychology, linguistics, statistics, and neuroscience. Machine learning has been described as the field of study that gives computers the ability to learn without being explicitly programmed.

SUMMARY

Shortcomings of the prior art are overcome, and additional advantages are provided, through the provision, in one aspect, of a method. The method can include, for example: obtaining utilization parameter values from first to Nth edge computing environments, training one or more predictive model by machine learning using parameter values of the utilization parameter values obtained by the iteratively obtaining, wherein the training includes training a first computing environment predictive model with use of parameter values of the utilization parameters obtained from the first computing environment by the iteratively obtaining, the first predictive model for predicting subsequent performance of the first edge computing environment; applying query data to the first computing environment predictive model to output a predicted utilization parameter value of the first edge computing environment at a subsequent time; and providing an action decision to reprovision the first edge computing environment with use of provisioning data, wherein the method includes determining the provisioning data in dependence on the predicted utilization parameter value and in dependence on an examination of an updated service level agreement parameter value for the first edge computing environment.

In another aspect, a computer program product can be provided. The computer program product can include a computer readable storage medium readable by one or more processing circuit and storing instructions for execution by one or more processor for performing a method. The method can include, for example: obtaining utilization parameter values from first to Nth edge computing environments, training one or more predictive model by machine learning using parameter values of the utilization parameter values obtained by the iteratively obtaining, wherein the training includes training a first computing environment predictive model with use of parameter values of the utilization parameters obtained from the first computing environment by the iteratively obtaining, the first predictive model for predicting subsequent performance of the first edge computing environment; applying query data to the first computing environment predictive model to output a predicted utilization parameter value of the first edge computing environment at a subsequent time; and providing an action decision to reprovision the first edge computing environment with use of provisioning data, wherein the method includes determining the provisioning data in dependence on the predicted utilization parameter value and in dependence on an examination of an updated service level agreement parameter value for the first edge computing environment.

In a further aspect, a system can be provided. The system can include, for example a memory. In addition, the system can include one or more processor in communication with the memory. Further, the system can include program instructions executable by the one or more processor via the memory to perform a method. The method can include, for example: obtaining utilization parameter values from first to Nth edge computing environments, training one or more predictive model by machine learning using parameter values of the utilization parameter values obtained by the iteratively obtaining, wherein the training includes training a first computing environment predictive model with use of parameter values of the utilization parameters obtained from the first computing environment by the iteratively obtaining, the first predictive model for predicting subsequent performance of the first edge computing environment; applying query data to the first computing environment predictive model to output a predicted utilization parameter value of the first edge computing environment at a subsequent time; and providing an action decision to reprovision the first edge computing environment with use of provisioning data, wherein the method includes determining the provisioning data in dependence on the predicted utilization parameter value and in dependence on an examination of an updated service level agreement parameter value for the first edge computing environment.

Additional features are realized through the techniques set forth herein. Other embodiments and aspects, including but not limited to methods, computer program product and system, are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
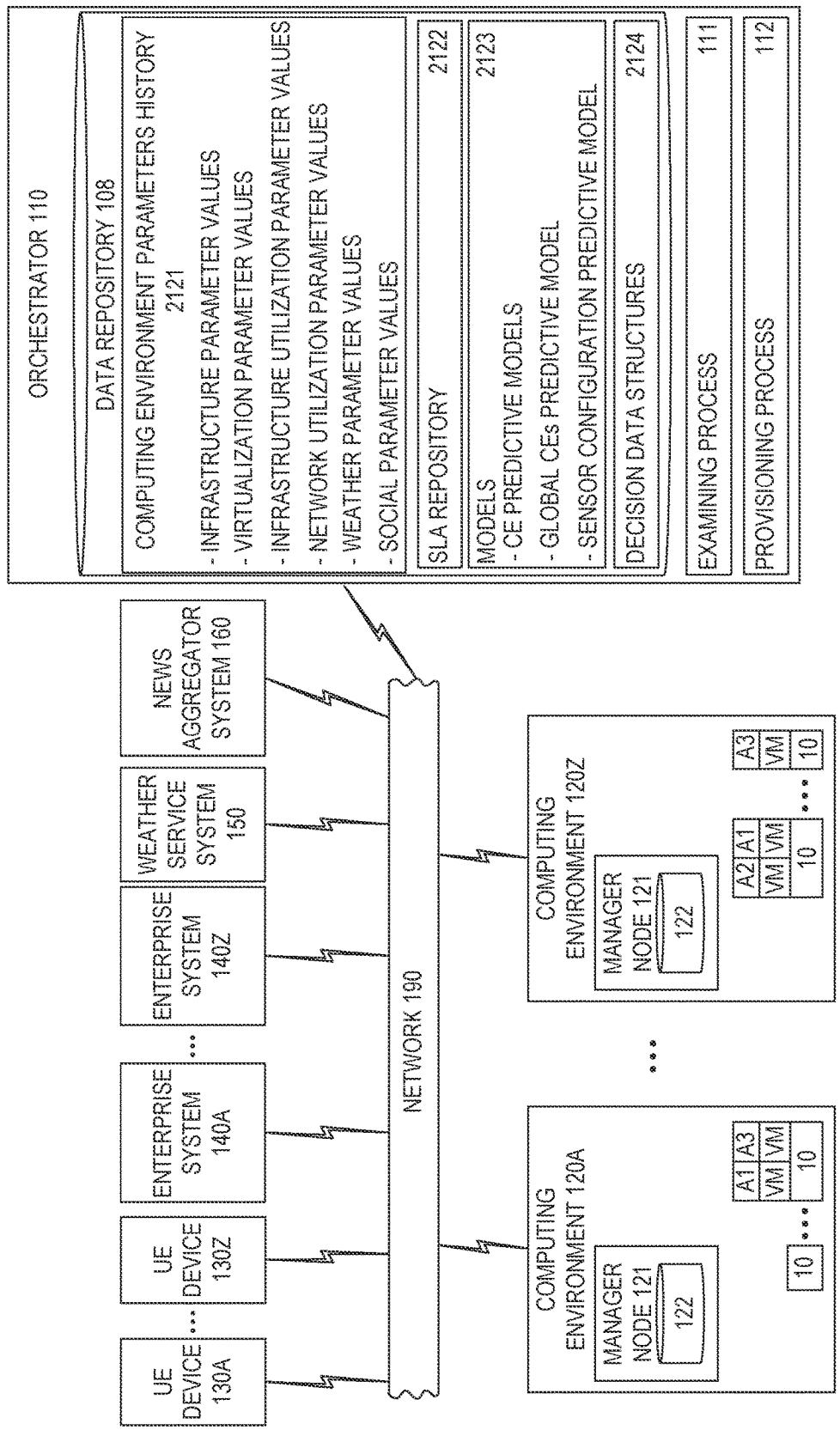
FIG. 1A depicts a system having an orchestrator and a plurality of computing environments according to one embodiment.

System 100 for use in predictively provisioning computing resources is shown in FIG. 1A. System 100 can include orchestrator 110 having an associated data repository 108, computing environments 120A-120Z, user equipment (UE) devices 130A-130Z, enterprise systems 140A-140Z, weather service system 150, and news aggregator system 160. Orchestrator 110, computing environments 120A-120Z, user equipment (UE) devices 130A-130Z, enterprise systems 140A-140Z, weather service system 150, and news aggregator system 160 can be in communication with one another via network 190. Orchestrator 110, computing environments 120A-120Z, user equipment (UE) devices 130A-130Z, enterprise systems 140A-140Z, weather service system 150, and news aggregator system 160 can be in communication with one another via network 190 can include numerous devices which can be computing node-based devices connected by network 190. Network 190 can be a physical network and/or a virtual network. A physical network can be, for example, a physical telecommunications network connecting numerous computing nodes or systems, such as computer servers and computer clients. A virtual network can, for example, combine numerous physical networks or parts thereof into a logical virtual network. In another example, numerous virtual networks can be defined over a single physical network.

Figure 1B:
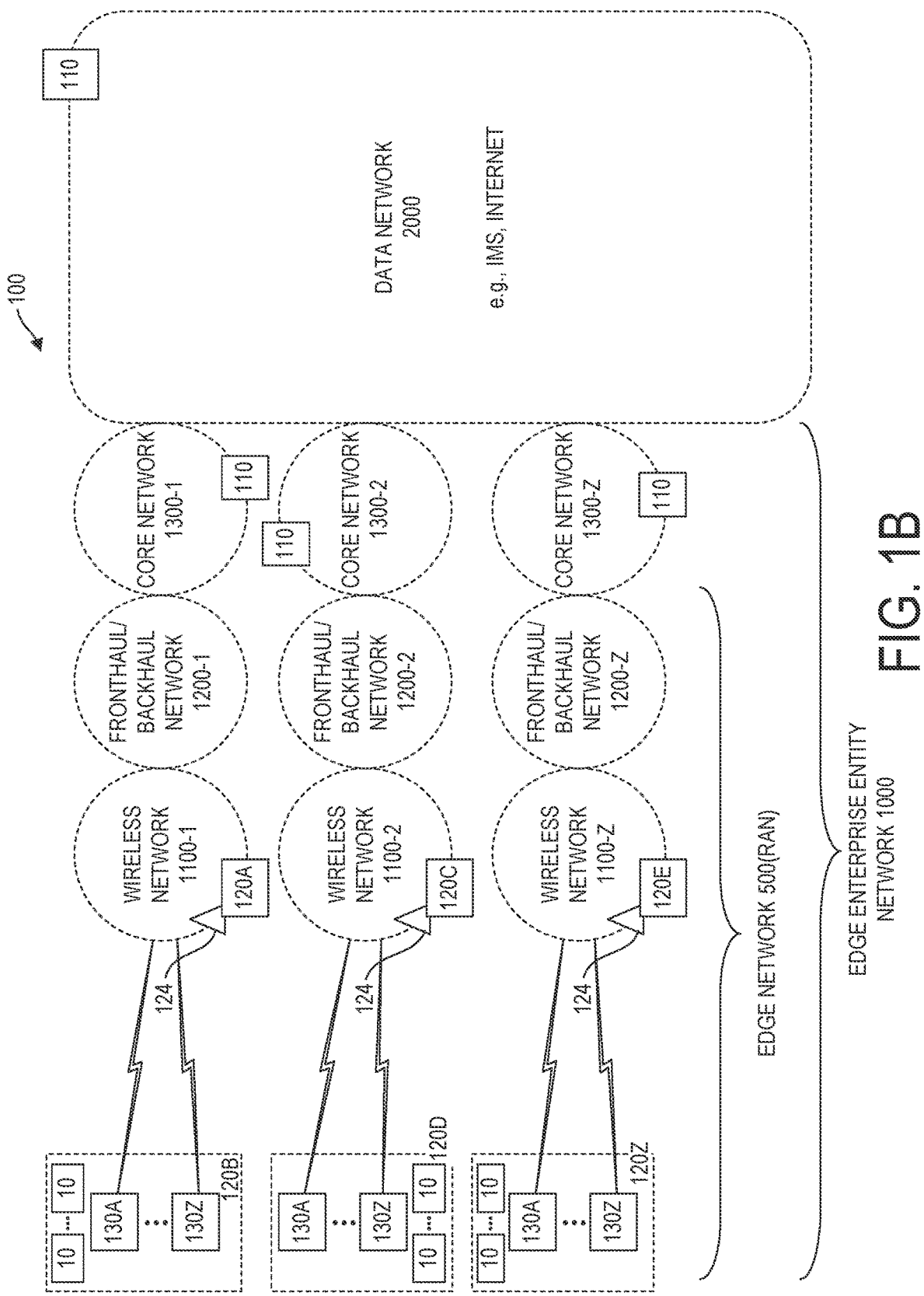
FIG. 1B is a physical network implementation view for the system of FIG. 1A according to one embodiment.

In one embodiment, computing environments 120A-120Z can be edge network computing environments (edge computing environments) disposed within an edge network. In one embodiment, computing environments of computing environments 120A-120Z can be base station-associated computing environments that are associated to one or more base station, e.g., by being disposed within a threshold number of hops from the base station, or by being within a common limited area geofence within a base station. In one embodiment, a respective computing environment, e.g., computing environment 120A, can be associated to one or more base station 124 as shown in FIG. 1B. A respective base station of one or more base station can be characterized by an antenna array, e.g., mounted on a base station tower, and one or more base station computing node connected to the antenna array. The antenna array can include one or more antenna. The one or more base station computing node can be configured, e.g., a nodeB computing node, an eNodeB computing node, or a New Radio (NR) computing node. By their being disposed within an edge network, and/or by their being associated to one or more base station, computing environments 120A-120Z can be regarded to be multi-access edge (MEC) computing environments.

Respective computing environments of computing environments 120A-120Z can include a manager node 121 having an associated data repository 122, and a plurality of computing nodes which can be provided by physical computing nodes. The physical computing nodes can host, e.g., one or more virtual machine, which one or more virtual machines can host software applications.

In one embodiment, orchestrator 110 can be external to computing environments 120A-120Z, enterprise systems 140A-140Z, weather service system 140, news aggregator system 150 and to each of the one or more UE devices 130A-130Z. In one embodiment, orchestrator 110 can be co-located with one or more of computing environments 120A-120Z, enterprise systems 140A-140Z, weather service system 150, news aggregator system 160, and to a client computer device of UE devices 130A-130Z.

Embodiments herein recognize that edge network disposed computing environments, such as computing environments 120A-120Z, can run a set of common software applications. Common software applications can include, e.g., image recognition software applications, artificial intelligence (AI) support software applications, and virtual network function (VNF) software applications. Certain software applications running within computing environments 120A-120Z can be types of software applications requiring low latency performance demanded by UE device clients being serviced by the running of the software applications.

UE devices 130A-130Z can include client computing devices being serviced by software applications running within computing environments 120A-120Z. UE devices 130A-130Z can include, e.g., personal UE devices associated to customer end user users and/or agent users. UE devices of UE devices 130A-130Z can include UE devices associated to agent users of enterprises that own, operate, and/or control infrastructure of computing environments 120A-120Z. UE devices of UE devices 130A-130Z can include UE devices associated to agent users of enterprises that own, operate, and/or control infrastructure of enterprise systems 140A-140Z. UE devices of UE devices 130A-130Z can include, e.g., smartphones, laptops, personal computers, tablets, smartwatches, and the like. UE devices of UE devices 130A-130Z can include enterprise IoT devices.

Enterprise systems 140A-140Z can be computing node-based systems of enterprises having applications hosted on computing environments 120A-120Z.

Weather service system 150 can be configured to provide weather data with respect to an area being serviced by system 100. Weather data can include, e.g., historical temperature data, precipitation data, wind data and weather event data. Weather data can include, e.g., current temperature data, precipitation data, wind data, and weather event data. Weather data can include, e.g., forecast temperature data, precipitation data, wind data, and weather event data. Weather events can include, e.g., storms including hurricanes, tornados, fog formations, heat waves, and cold waves. Weather service system 150 can store weather data associated to different regions of an area being serviced by system 100.

News aggregator system 160 can be provided by, e.g., a server with appropriate software for aggregating syndicated web content such as online new papers, blogs, or podcasts in a central location for easy access. News aggregator system 160 can include a rich site summary (RSS) synchronized subscription system. RSS uses extensible markup language (XML) to structure pieces of information to be aggregated in a feed reader. Distributed updates can include, e.g., journal tables of contents, podcasts, videos, and news items. News aggregator system 160 can include human selected and entered content as well as automatically selected content, selected with use of auto-selection algorithms. Rich site summary (RSS) feeds can include text and metadata that specifies such information as publishing date and author name.

Orchestrator 110 can be configured to obtain computing environment characterizing parameter values characterizing the various computing environments of computing environments 120A-120Z. Orchestrator 110 can also be configured to store the obtained computing environment characterizing parameter values in data repository 108.

Orchestrator 110 in data repository 108 can store various data. In computing environment parameters history area 2121, data repository 108 can store, e.g., infrastructure parameter values, virtualization parameter values, infrastructure utilization parameter values, network utilization parameters values, weather parameter values, and social parameter values. The described parameter values can characterize the various computing environments of computing environments 120A-120Z.

Infrastructure parameter values can include such parameter values as numbers of computing nodes 10 provided by physical computing nodes, number of base stations serviced, numbers of clusters, numbers of computing nodes per cluster, computing node (CPU) capacity, memory capacity, storage capacity, and network capacity (bandwidth). Computing node capacity, memory capacity, and storage capacity can be expressed in terms of aggregate computing environment capacity and/or can be reported on a per computing node basis.

Virtualization parameter values can include, e.g., numbers of virtual machines and/or resource provisioning parameter values associated to the various virtual machines. Virtual machines herein can include, e.g., hypervisor-based virtual machines or container-based virtual machines.

Infrastructure utilization parameters can include, e.g., CPU utilization parameters, memory utilization parameters, and/or storage utilization parameters. It will be understood that infrastructure availability parameter values can be derived at any time with use of the reported utilization parameters based on the contemporaneously reported capacity parameter values.

Network utilization parameters can include, e.g., throughput parameter values expressed, e.g., in terms of bits per second (BPS), response time parameter values, latency parameter values, and packet loss (error rate) parameter values, concurrent users parameter values, which specifies the number of active users at a given time, and/or a requests per second (RPS) parameter value which specifies a number of requests for a digital asset received over time. It will be understood that network availability parameter values can be derived at any time with use of the reported utilization parameters based on the contemporaneously reported capacity parameter values, including network capacity parameter values.

Weather parameter values can include, e.g., weather parameter values specifying temperature and/or precipitation parameter values associated to a certain computing environment, e.g., mapping to the same geospatial area of a computing environment.

Social parameter values can include, e.g., data specifying entertainment events within a geospatial area of a computing environment. In some use case scenarios, it is anticipated that a computing environment of computing environments 120A-120Z can map to an events venue, e.g., a stadium, conference center, convention center, or the like. Respective computing environments of computing environments 120A-120Z, by manager node 121, can be configured to poll available news aggregator resources such as news aggregator system 160 to ascertain the timing of such events and store data of such events into respective data repositories 122 of respective manager nodes 121.

Social parameter values can also include, e.g., parameter values indicating user experience satisfaction levels. Orchestrator 110 can be configured to present web-based user interface forms that are displayed on displays of UE devices 130A-130Z that permit users to specify their level of satisfaction with an application-based service running within a computing environment of computing environments 120A-120Z. In another aspect, orchestrator 110 can be configured to derive user satisfaction parameter values by examination of network utilization parameter values. For example, orchestrator 110 can monitor throughput in bits per second associated to a connection to a certain user and can record an increase in the throughput of the connection as an increase in satisfaction level of the user and as an indication of positive satisfaction of the user.

Orchestrator 110 in service level agreement (SLA) repository 2122 can store current SLA data for each of the respective computing environments of computing environments 120A-120Z. SLA data stored in SLA repository 2122 can be tagged with an identifier that identifies the computing environment of computing environments 120A-120Z to which the SLA data pertains.

In one embodiment, orchestrator 110 can be operated by an edge enterprise entity that owns, operates, and/or controls computing environments of computing environments 120A-120Z. The edge enterprise entity can make available hosting services that facilitate hosting of applications of other entities thereon, such as entities that are associated with enterprise systems 140A-140Z.

Embodiments herein recognize that with a deployment of tens, hundreds, thousands, or even millions of edge computing environments, and wherein the various edge computing environments can include relatively small numbers of virtualization of infrastructure and virtualization elements, numerous different computing environments over a geospatial area can exhibit a threshold satisfying level of similarity. For predicting behavior of a target computing environment after it is subject to an infrastructure and/or virtualization parameter value adjustment, orchestrator 110 can identify within a systemwide distribution of computing environments a computing environment having a threshold-satisfying level of similarity with the virtually reprovisioned computing environment.

Embodiments herein recognize that with edge computing, there can be significant use case scenarios wherein predictive models for computing environments other than a target computing environment can be useful in performing predictive analytics. One reason is that, with smaller edge data centers, there can be a reduced number of hardware and virtualization infrastructure components, increasing the likelihood of there being similarity between different computing environments, e.g., different edge computing environments in different geospatial locations such as in different states, time zones, and the like.

An SLA agreement herein can refer to an agreement between an edge enterprise entity that provides hosting services and another entity. Embodiments herein recognize that as the web hosting agreement proceeds in time, the SLA data defining the scope of the hosting agreement can change. SLA repository 2122 can store current SLA data specifying current terms of each agreement for each hosting agreement, as well as a history of such agreements in prior iterations. System 100 can be configured so that changes to any SLA agreement are automatically piped into SLA repository 2122 for recordation. The automatic piping can include piping of SLA data from enterprise service systems 140A-140Z having a services hosting agreement with edge enterprise entity operating orchestrator 110. The scheduling of piping of SLA data can be based on configuration data of administrator users associated to the enterprise entities of enterprise systems 140A-140Z as defined using UE devices of UE devices 130A-130Z associated to such enterprise users.

Orchestrator 110 in models area 2123 can store predictive models that can be used for return of action decision by orchestrator 110. In models area 2123, orchestrator 110 can store, e.g., computing environment (CE) predictive models, global computing environments (CEs) predictive models, and one or more sensor configuration predictive model.

In one embodiment, orchestrator 110 can be configured to establish and train a dedicated predictive model for predicting the behavior of each respective computing environment of computing environments 120A-120Z. For performing training of such dedicated predictive models modeling the behavior of each respective computing environment of computing environments 120A-120Z, orchestrator 110 can iteratively train such predictive models using training data that includes infrastructure utilization parameter values and network utilization parameter values obtained from each respective computing environment of computing environments 120A-120Z. Trained using the described training data, the respective predictive models associated to the various different computing environment of computing environments 120A-120Z can predict the behavior of the various computing environments.

In another aspect, orchestrator 110 in models area 2123 can store a global CEs predictive model. The global CEs predictive model, in one embodiment, can be trained using training data provided by computing environment characterizing parameter values associated to a plurality of computing environments of computing environments 120A-120Z, and in one embodiment, all of such computing environments of computing environments 120A-120Z. Trained with the described global training data, the global computing environments predictive model can be useful, e.g., for a variety of different tasks in providing recommendations as to upgrades of a computing environment in terms of infrastructure configuration that specifies a number and/or type of computing nodes provided by physical computing nodes or a virtualization configuration specifying, e.g., a number and/or type of virtual machines hosted within a computing environment.

The CE predictive models and global CEs predictive model can be differentiated in terms of their respective training data. The majority of training data for training a CE predictive model can be associated to the computing environment of computing environments to which it pertains. The training data for training the global CEs predictive model can include computing environments characterizing parameter values of a plurality of different computing environments such that no single computing environment provides training data defining a majority of training data for training the global CEs predictive model.

Orchestrator 110 in decision data structures area 2124 can store decision data structures, e.g., decision tables and/or decision trees for return of action decisions.

Orchestrator 110 can run various processes including examining process 111 and provisioning process 112. Orchestrator 110 running examining process 111 can include orchestrator 110 performing a variety of different functions. Orchestrator 110 running examining process 111 can include orchestrator 110 examining history data of a current target computing environment to ascertain a predicted future utilization level associated to the target computing environment. In the examining of the described history data, orchestrator 110 can be comparing the predicted future utilization level to SLA requirements data specified for the target computing environment as retrieved iteratively from SLA repository 2122. Orchestrator 110 in the performance of examining process 111 can perform examining of SLA requirements from updated SLA data stored in SLA repository 2122 and can compare the SLA data to future predicted utilization levels of a computing environment of computing environments 120A-120Z.

Orchestrator 110, in performing examining process 111, in another aspect, can perform discovering of a growth trend of a target computing environment targeted in one embodiment and can perform a regression analysis for performance of identification in discovering of a growth trend associated to a computing environment.

Orchestrator 110 in performing examining process 111 can perform querying of a global predictive model in dependence for return of infrastructure and/or virtualization configuration adjustment data. A global predictive model can be trained with training data from a plurality of computing environments.

Orchestrator 110 in the performance of examining process 111 can perform digitally adjusting a target computing environment in dependence on the returned adjustment data to virtually reprovision a target computing environment to include virtually adjusted computing environment characterizing parameter values.

Orchestrator 110 in the performance of examining process 111 can perform identifying matching computing environments having threshold satisfying similarity with the target computing environment as virtually reprovisioned. Orchestrator 110 performing examining process 111 can perform discovering simulation scenarios using historical data stored in computing environment parameters history area 2121. Orchestrator 110 running examining process 111 can run a discovered simulation scenario using computing environment predictive model associated to a computing environment matching a virtually reprovisioned target computing environment based on a similarity threshold.

Orchestrator 110 running provisioning process 112 can include orchestrator 110 sending provisioning data to provision the target computing environment. Provisioning data can include provisioning data, e.g., to adjust the computing node infrastructure parameter value of a target computing environment and/or a virtualization infrastructure parameter value of a target computing environment, e.g., adjusting a number and/or type of computing nodes and adjusting a number and/or type of virtual machines.

FIG. 1B depicts a physical network implementation view of system 100. System 100 can include UE devices 130A-130Z in communication with data network 2000 via a plurality of edge enterprise entity networks 1000. System 100, as set forth herein, including in reference to FIG. 1A and FIG. 2, can be compliant with Fifth Generation (5G) technologies, including the New Radio (NR) standard, documents of 3GPP TS 28.530 V15.1.0 Release 15 by the 3$^{rd}$ Generation Partnership Project (3GPP), and the technical reports of Release 16 of the 3GPP (3GPP Release 16 reports).

Respective edge enterprise entity networks 1000 can include edge infrastructure owned, operated, and/or controlled by one or more edge enterprise entity distributed throughout different geospatial regions within a geospatial area. In one embodiment, a certain edge enterprise entity can own, operate, and/or control the edge network infrastructure comprising wireless network 1100-1, fronthaul/backhaul network 1200-1, and core network 1300-1 in a first geospatial region. The certain edge enterprise can own, operate, and/or control the edge infrastructure comprising wireless network 1100-2, fronthaul/backhaul network 1200-2, and core network 1300-2 on a second geospatial region. The certain edge enterprise entity can own, operate, and/or control the edge infrastructure comprising wireless network 1100-Z, fronthaul/backhaul network 1200-Z, and core network 1300-Z in a third geospatial region. In another example, the different edge enterprise entity networks 1000 can be owned, operated, or controlled by different edge enterprise entities. Different respective ones of the edge enterprise entities can be telecommunications network providers which are sometimes referred to as communication service providers (edge enterprise entity CSPs).

In the described embodiment of FIG. 1B, the combination of a wireless network and a fronthaul network can define edge network 500 including a radio access network (RAN). Edge network 500 can define edge infrastructure. The depicted RANs provide access from UE devices 130A-130Z to respective core networks. In an alternative embodiment, one or more of edge networks 500 can be provided by a content delivery network (CDN).

Each of the different UE devices 130A-130Z can be associated to a different user, e.g., a customer end user or an enterprise agent user. A UE device of UE devices 130A-130Z, in one embodiment, can be a computing node device provided by a client computer, e.g., a mobile device, e.g., a smartphone or tablet, a laptop, smartwatch, or PC that runs one or more program that facilitates access to services by one or more service provider. A UE device of UE devices 130A-130Z can alternatively be provided by, e.g., an internet of things (IoT) sensing device.

Embodiments herein recognize that hosting service functions on one or more computing node within an edge enterprise entity network 1000 can provide various advantages including latency advantages for speed of service delivery to end users at UE devices 130A-130Z. Edge enterprise entity hosted service functions can be hosted, e.g., within edge network 500 or otherwise within edge enterprise entity network 1000.

Data network 2000 can include, e.g., an IP multimedia sub-system (IMS) and/or "the internet" which can be regarded as the network of networks that consist of private, public, academic, business, and government networks of local to global scope linked by a broad array of electronic, wireless, and optical networking technologies. Data network 2000 can include, e.g., a plurality of non-edge data centers. Such data centers can include private enterprise data centers as well as multi-tenancy data centers provided by IT enterprises that provide for hosting of service functions developed by a plurality of different enterprise entities.

Orchestrator 110, in one embodiment, can be disposed in data network 2000. In one embodiment, orchestrator 110 can be iteratively replicated from data network 2000 into respective ones of core network 1300-1, 1300-2, and 1300-Z. As shown in FIG. 1B, the different computing environments of computing environments 120A-120Z can be disposed in geospatially differentiated regions over an area. In one example, the different geospatial regions can be spaced apart in different geospatial regions. The different geospatial regions defined by a footprint of a respective computing environment can be in different e.g., counties, cities, states, and/or different countries. The different computing environments of computing environments 120A-120Z can each respectively be disposed in a different edge network 500, and particularly each respective computing environment 120A-120Z can be disposed in a different wireless network associated to a particular edge network. The different geospatial regions can include geospatial regions that are located, e.g., about 1K apart or more, about 10K apart or more, about 100K apart or more, or about 1000K or more (e.g., East Coast and West Coast in the United States). By being disposed within an edge network 500, a computing environment can be regarded as an edge computing environment.

Figure 2:
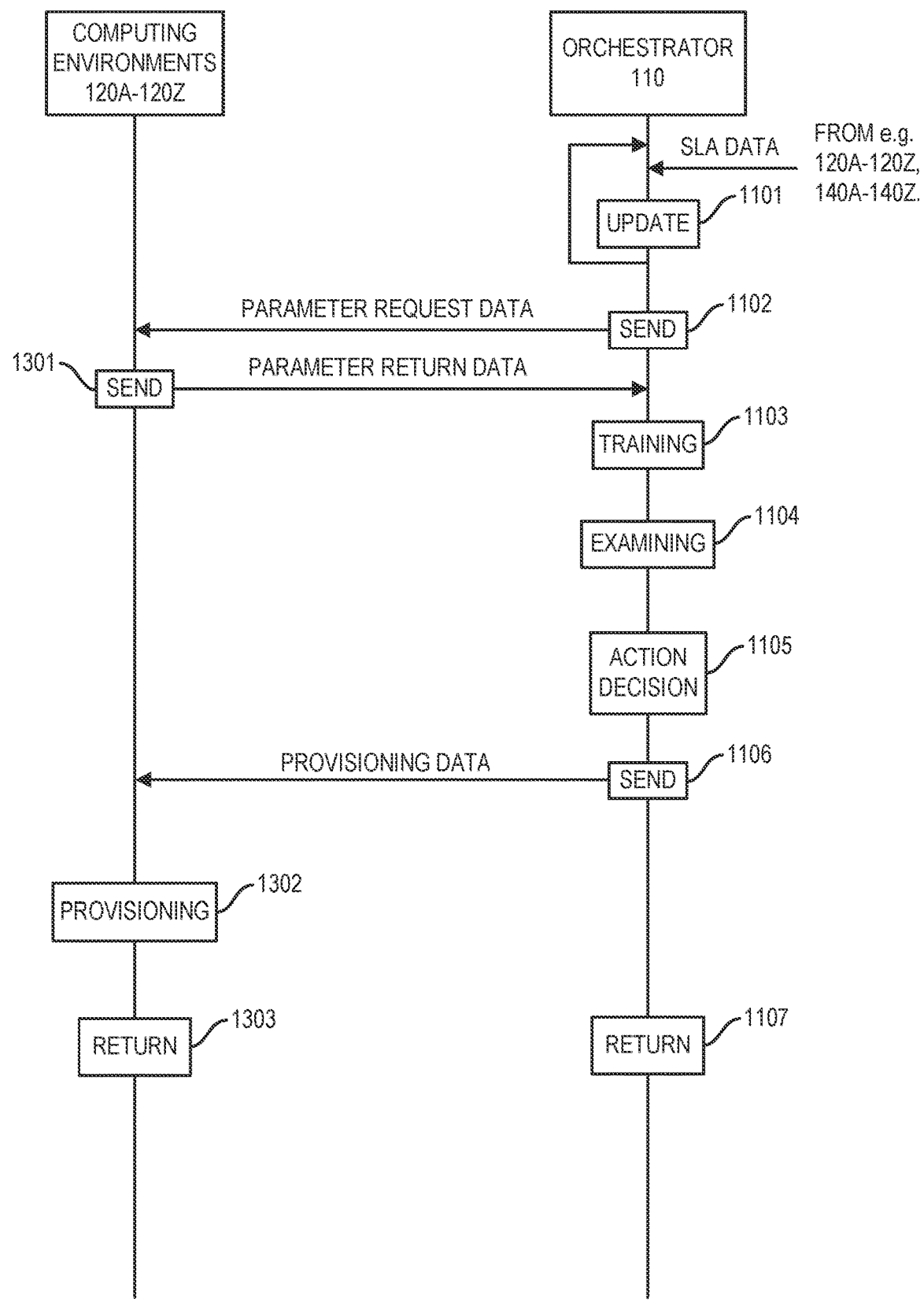
FIG. 2 is a flowchart illustrating performance of a method for performance by an orchestrator interoperating with computing environments according to one embodiment.

A method for performance by orchestrator 110 interoperating with computing environments 120A-120Z is described in reference to the flowchart of FIG. 2. At block 1101, orchestrator 110 can be performing updates of SLA data for storage into SLA repository 2122. Orchestrator 110 can be receiving SLA data updates, e.g., from enterprise systems 140A-140Z associated to enterprise entities availing themselves to the services provided by orchestrator 110. In another envisioned use case, updated SLA data can be received from UE devices of UE devices 130A-130Z as may be defined by enterprise entity agent users associated to enterprise systems 140A-140Z. On receipt of updated SLA data, orchestrator 110 at update block 1101 can perform updating of SLA data for each computing environment of computing environments 120A-120Z. Received updated SLA data can be tagged with an identifier that identifies a particular computing environment of computing environments 120A-120Z. SLA updates can be tagged with timestamps that specify the time of the update to the SLA data as well as timing requirements for any SLA specified metrics to be achieved. As indicated by the return arrow of the flowchart of FIG. 2, orchestrator 110 can iteratively be performing the receipt of SLA data and the updating at block 1101 for a deployment period of orchestrator 110.

While iteratively performing the receipt of SLA data and the updating at block 1101, orchestrator 110 can simultaneously branch to perform blocks 1102-1107 depicted in the flowchart of FIG. 2. At block 1102, orchestrator 110 can be sending parameter request data to computing environments 120A-120Z.

At training block 1103, orchestrator 110 can perform training of various predictive models that can be maintained and trained by orchestrator 110, wherein the training can comprise training using received computing environment characterizing parameter values sent by computing environments 120A-120Z at block 1301.

At training block 1103, orchestrator 110 can train various predictive models. In one aspect, training of computing environment predictive model 3002 is illustrated with reference to FIG. 3. Computing environment predictive model 3002 can be trained with iterations of training data. The training data for training CE predictive model 3002 can include training data from a specific computing environment of computing environments 120A-120Z. CE predictive model 3002 can be specifically trained to predict behavior of a particular one of computing environments of computing environments 120A-120Z, and orchestrator 110 can be configured to separately train a different instance of CE predictive model 3002 for each respective computing environment of computing environments 120A-120Z. Orchestrator 110 can iteratively train K instances of CE predictive model, one for each computing environment of computing environments 120A-120Z.

Orchestrator 110 can be configured so that training data for training CE predictive model 3002 associated to a certain computing environment of computing environments 120A-120Z includes computing environment characterizing parameter values associated to that certain computing environment. CE predictive model 3002 can be trained with iterations of training data and once trained, CE predictive model 3002 can be configured to return predictions. An iteration of training data for training CE predictive model 3002 can include (a) infrastructure utilization parameter values, (b) a set of network utilization parameter values and timing parameter values specifying timing data associated to infrastructure utilization parameter values, and (c) timing parameter values specifying time data associated to the infrastructure utilization parameter values and the network utilization parameter values of (a) and (b) respectively.

Trained as described, CE predictive model 3002 can learn an interrelationship between utilization parameter values, as well as time trends associated to the behavior of a certain computing environment. For example, embodiments herein recognize that a certain computing environment can exhibit time of day trends, wherein peak loading behavior might occur at certain times, e.g., during rush hour, or in the case of an industrial facility, a change in staffing shift time. Trained as described with sufficient iterations of training data, CE predictive model 3002 can be configured to respond to query data.

Query data for query of CE predictive model 3002 can include, e.g., a subset of utilization parameter values together with timing parameter values. For example, CE predictive model 3002 might be queried with query data that comprises the utilization parameter specifying 1,500 concurrent users at the time of business day parameter value 17:00 hours (or another combination of parameter values) and returned predicted computing environment characterizing parameter values can include, e.g., predicted infrastructure utilization parameter values and network utilization parameter values associated with the specified concurrent users data and timing data input as query data. In one aspect as described herein, CE predictive model 3002 can be configured return growth trend predictions in respect to one or more utilization parameter value, e.g., with use of regression analytics. For such use cases, CE predictive model 3002 can be queried with use of query data that specifies a future time, and CE predictive model 3002 can return a prediction as to utilization as to the specified future time.

In addition to maintaining computing environment predictive models 3002 for predicting the behavior respective computing environments of computing environments 120A-120Z, orchestrator 110 can maintain and iteratively train a global computing environments (CEs) predictive model 4002.

Figure 4:
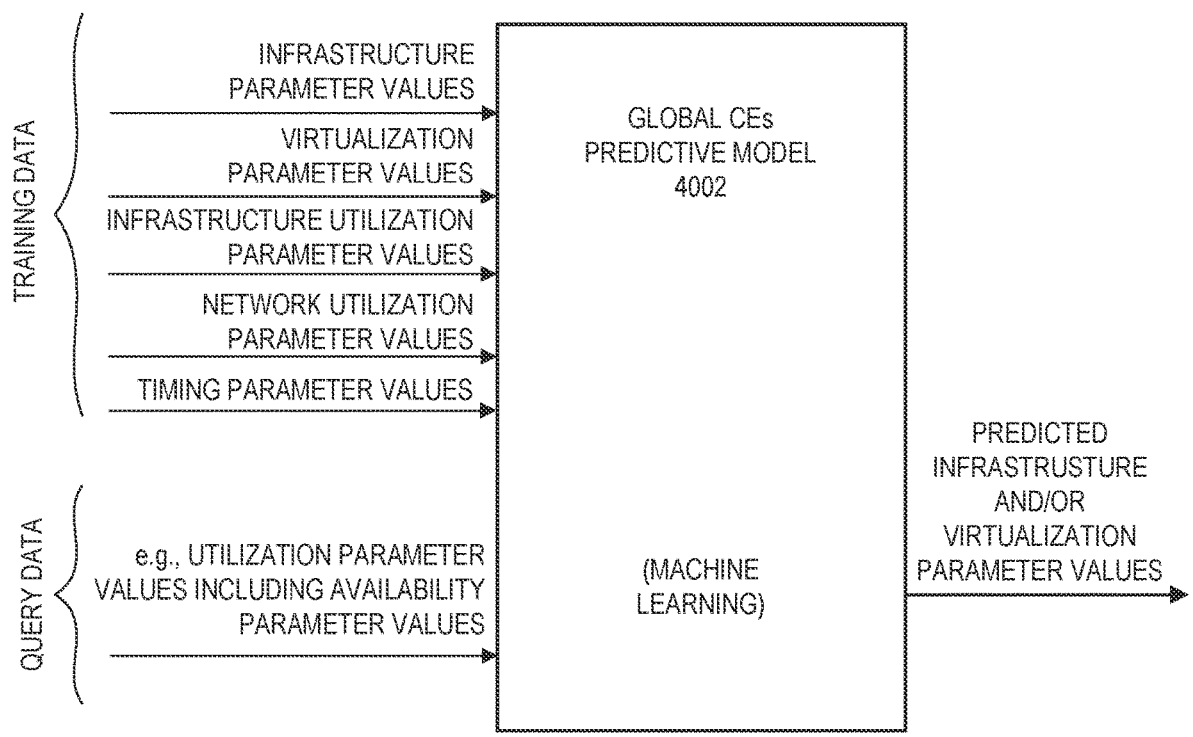
FIG. 4 depicts a global computing environment's predictive model.

Referring to FIG. 4, orchestrator 110 at training block 1103 can train a global CEs predictive model 4002. Global CEs predictive model 4002 can be configured to provide predictions as to infrastructure computing environment parameter values and virtualization computing environment parameter values required to satisfy specified target utilization parameter values. Such target utilization parameter values can include target availability parameter values. In one embodiment, training data for training global CEs predictive model 4002 can include a comprehensive set of computing environment characterizing parameter values that characterizes each respective computing environment of computing environments 120A-120Z. Such comprehensive characterizing computing environment parameter values can include, e.g., infrastructure computing environment characterizing parameter values and virtualization computing environment characterizing parameter values.

Global CEs predictive model 4002 can be trained with iterations of training data and on completion of training can be configured to respond to query data. An iteration of training data for training global CEs predictive model 4002 can include the combination of the following characterizing a certain computing environment: (a) infrastructure parameter values, (b) virtualization parameter values, (c) infrastructure utilization parameter values, (d) network utilization parameter values, and (e) timing parameter values.

Figure 3:
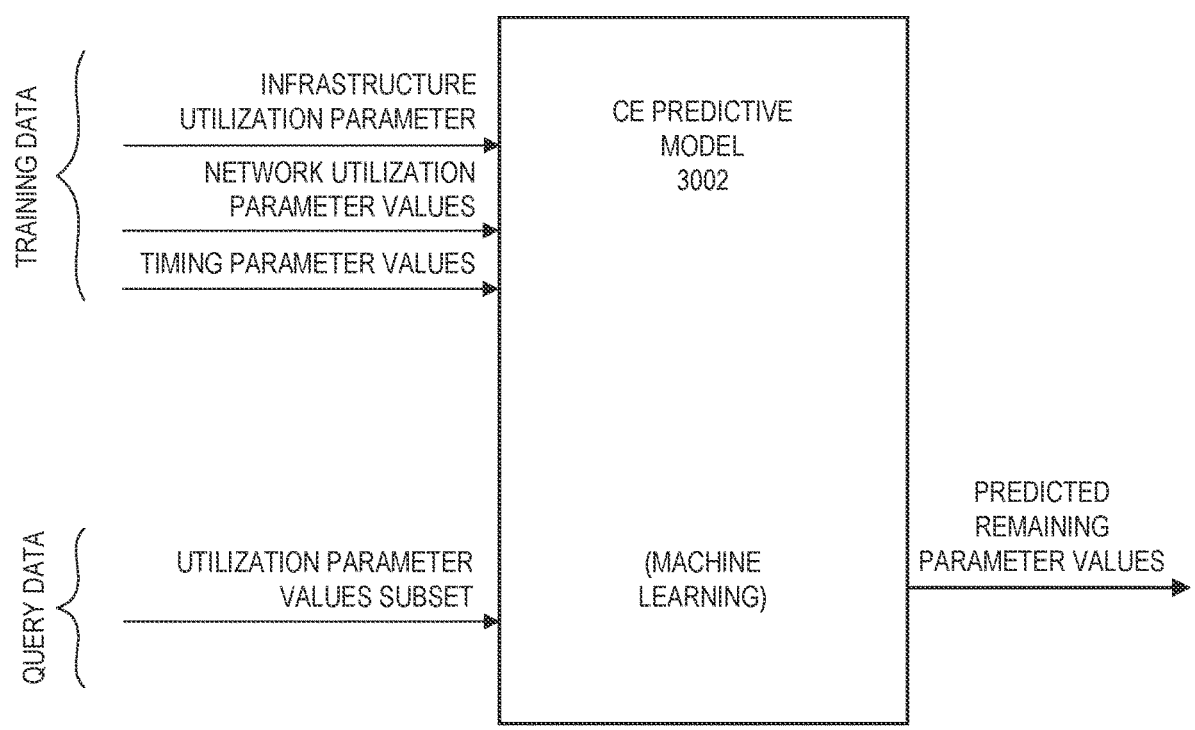
FIG. 3 depicts a predictive model for a computing environment.

In one embodiment, the timing parameter values for training of global CEs predictive model 4002 can have lower resolution than the training data parameter values for training of an instance of CE predictive model 3002 as described in reference to FIG. 3. An iteration of training data for training global CEs predictive model 4002 can include, e.g., coarse utilization parameter values associated to coarse timing parameter values, e.g., relating to average utilization per day, whereas time series data for training an instance of computing environment predictive model 3002 can include timing parameter values of higher resolution, e.g., once per hour, once per second, and so on.

Trained as described, global CEs predictive model 4002 is able to learn a relationship between infrastructure parameter values, virtualization parameter values, and utilization parameter values. Therefore, for example, for a given target utilization level, global CEs predictive model 4002, once trained, can predict a combination of infrastructure parameter values, e.g., expressed in terms of numbers of computing nodes (a count of computing nodes) and virtualization parameter values, e.g., expressed in terms of numbers of virtual machines (a count of virtual machines) that are predicted to be useful in achieving the target utilization parameter values.

Global CEs predictive model 4002, once trained, is able to respond to query data. Query data for querying global CEs predictive model 4002 can comprise different combinations of query data. In one example, query data for querying global CEs predictive model 4002 can include a subset of utilization parameter values, e.g., a target infrastructure utilization parameter value in combination with a target network utilization parameter value in combination with a number of concurrent users' parameter value, or another combination of parameter values.

With the described combination of computing environment characterizing parameter values as query data, global CEs predictive model 4002 can respond with output response data that comprises a set of infrastructure parameter values and virtualization parameter values that can achieve the specified utilization-related parameter values. Utilization parameter values can also include availability parameter values.

On completion of training block 1103 to train various predictive models, orchestrator 110 can proceed to examining block 1104. At examining block 1104, orchestrator 110 can examine updated SLA parameter values data in connection with predicted performance data specifying a predicted performance of a target computing environment targeted for parameter value adjustment.

Orchestrator 110, in response to examining at block 1104, can proceed to action decision block 1105. At action decision block 1105, orchestrator 110 can determine that one or more parameter value of a targeted computing environment is to be adjusted. While training at block 1103 is depicted as preceding examining at block 1104, embodiments herein recognize that orchestrator 110 can perform training 1103 subsequent to or concurrently with the examining at block 1104, and that the prior performance of examining can be beneficial given latencies associated to certain training processes.

Figure 6:
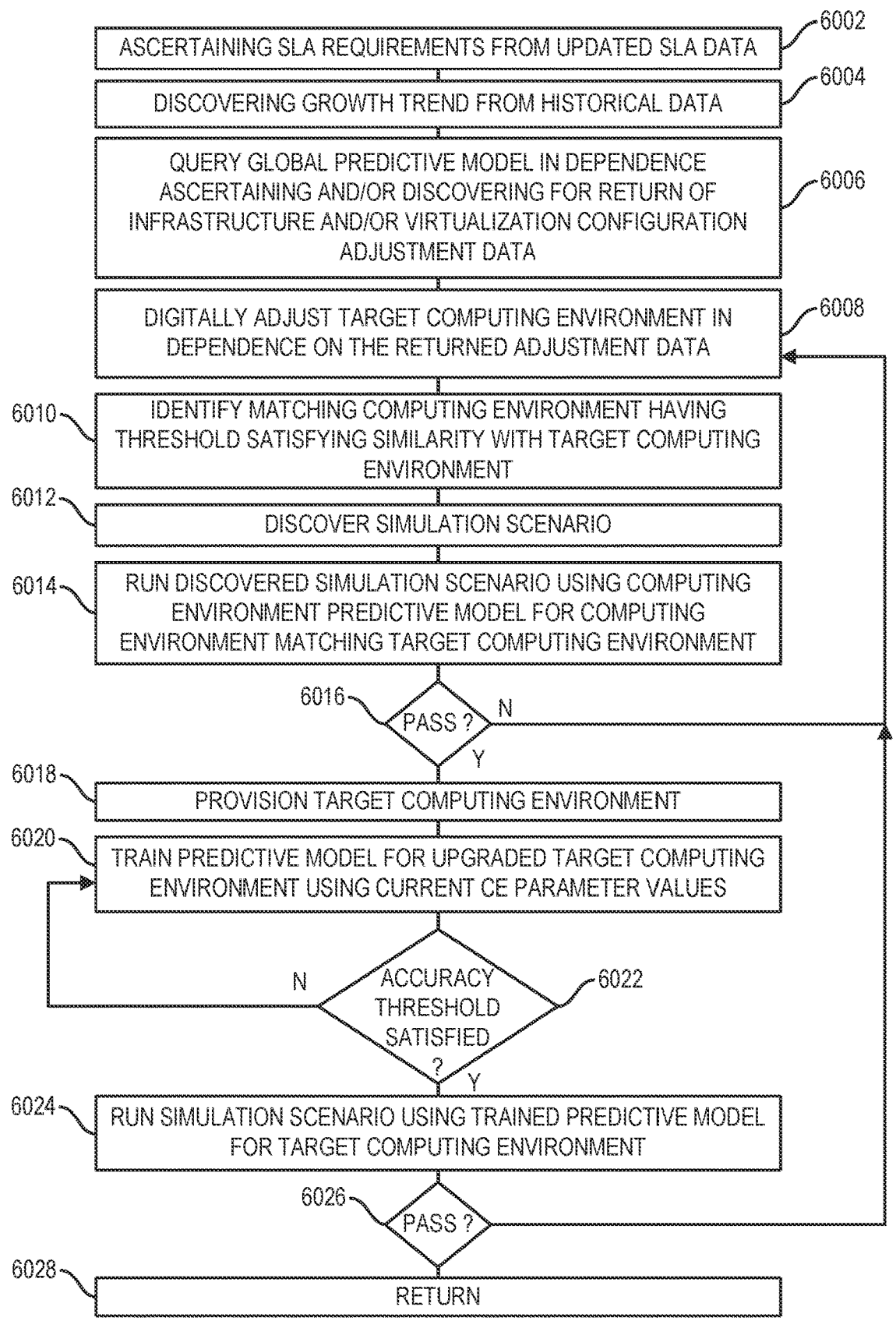
FIG. 6 is a flowchart for performance by an orchestrator according to one embodiment.

A method for performance of examining block 1104 and action decision 1105, according to one example, is described in reference to the flowchart of FIG. 6. At block 6002, orchestrator 110 can perform ascertaining of SLA requirements from updated SLA data stored in SLA repository 2122 as shown in FIG. 1A.

Figure 7:
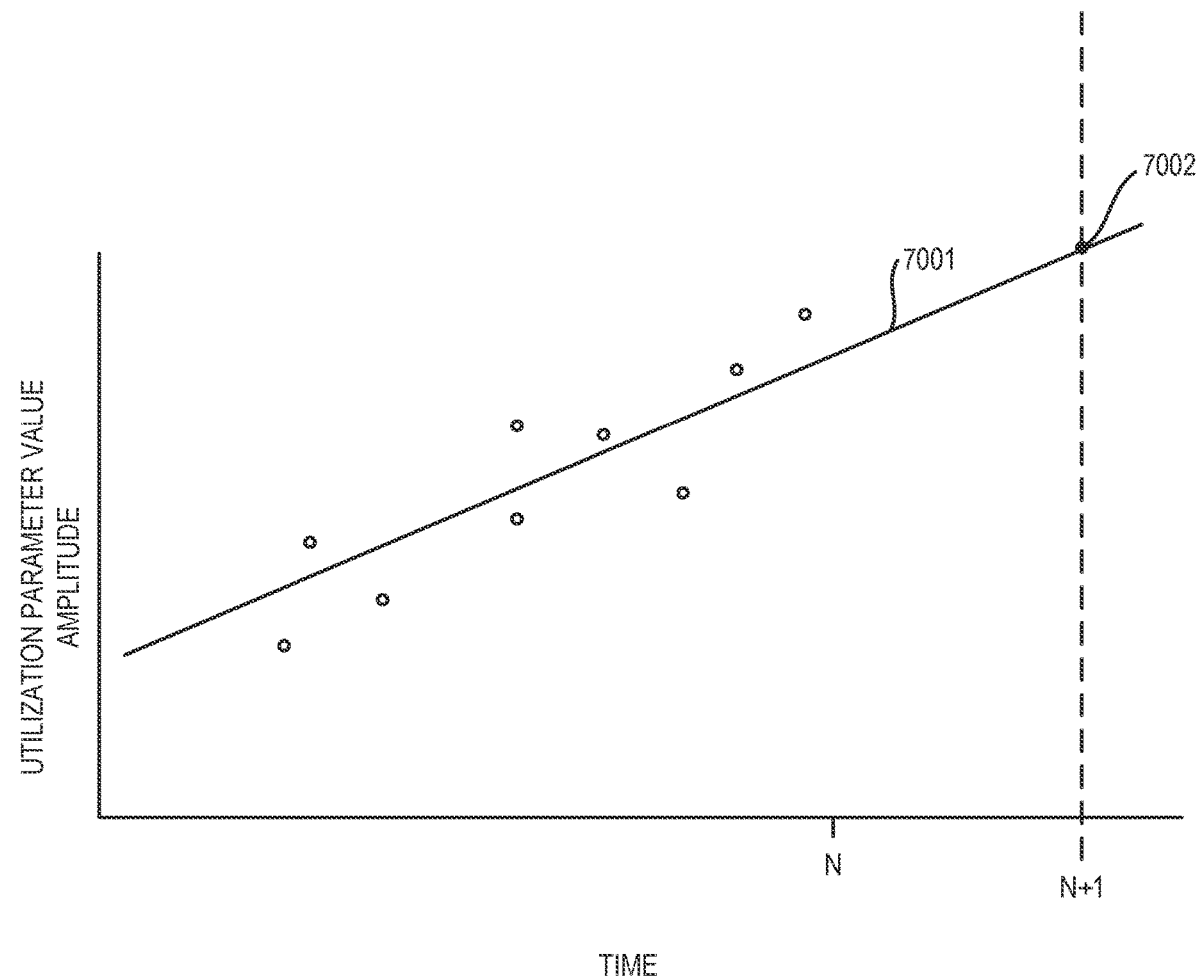
FIG. 7 depicts a regression analysis method for performance by an orchestrator according to one embodiment.

On completion of block 6002, orchestrator 110 can proceed to block 6004. At block 6004, orchestrator 110 can perform discovering of a growth trend of utilization data with respect to a target computing environment based on an analysis of historical data. The historical data can include historical data stored in computing environment parameters history area 2121. Exemplary trend analysis is shown in FIG. 7. FIG. 7 illustrates a regression analysis for an arbitrary utilization parameter value, which can be a utilization parameter value such as an infrastructure utilization parameter value and/or a network utilization parameter value as set forth herein.

The utilization parameter value can be, e.g., an infrastructure utilization parameter value and/or network utilization parameter value. Orchestrator 110 can iteratively reestablish regression line 7001 based on newly available data points provided by, e.g., utilization parameter values. At current time N, the regression line 7001 indicates that at a next time period N+1, the expected utilization parameter value for the arbitrary utilization parameter will be at data point 7002 according to the regression analysis. In one embodiment, CE predictive model 3002 of FIG. 3 can be configured to perform regression analytics so that predictive model 3002 is responsive to query data that species a future time, e.g., time N+1.

At block 6004, the regression analysis depicted in FIG. 7, according to one embodiment, can comprise average utilization values, e.g., over monthly periods. In one example, the time N+1 can be a time, e.g., one month or one week or one day from a current time period. Orchestrator 110 at block 6004 can obtain predicted future utilization parameter values using regression analysis as depicted in FIG. 7, e.g., involving CPU utilization, memory utilization, storage utilization, throughput utilization, and concurrent user's utilization.

Embodiments herein recognize that with edge computing, there can be significant envisioned scenarios wherein predictive models for computing environments other than a target computing environment, and trained with training data from a computing environment other that the current computing environment, can be useful in performing predictive analytics. One reason is that, with localized edge data centers, there can be a reduced number of hardware and virtualization infrastructure in utilization components, increasing the likelihood of there being a similarity between different computing environments, e.g., different edge computing environments in different geospatial locations such as in different states, time zones, and the like.

With the predicted future utilization values determined by regression analytics in one example, orchestrator 110 can proceed to block 6006. At block 6006, orchestrator 110 can query global CEs predictive model 4002 as shown in FIG. 4. At block 6006, orchestrator 110 can query global CEs predictive model 4002 in dependence on the ascertaining at block 6002 and/or the growth trend discovering at block 6004 for return of target computing environment infrastructure and/or virtualization configuration adjustment data.

In one embodiment, orchestrator 110 at block 6006 can query global CEs predictive model 4002 with predicted growth trend utilization parameter values as determined by the regression analysis as depicted in FIG. 7 and with SLA availability usage parameter values as determined by ascertaining SLA requirements at block 6002.

Embodiments herein recognize that SLA data can comprise minimal availability data which specifies a minimum availability that can remain with respect to any utilization parameter value. The availability parameter value can be calculated as a measure of the utilization parameter value as a proportion of the capacity. For reliable operation of an arbitrary computing environment, it can be specified in an SLA agreement that a minimal availability threshold for any utilization parameter value be maintained during deployment period.

At block 6006, orchestrator 110 on querying global CEs predictive model 4002 with the described query data, e.g., comprising a growth trend utilization parameter value, and an SLA specified availability parameter value can obtain return data that specifies infrastructure parameter values and/or virtualization parameter values that are predicted to support the referenced utilization parameter values including availability parameter values input as query data at a future time period.

Infrastructure parameter values can include, e.g., parameter values specifying a computing node count, types of computing nodes, virtual machine count, types of virtual machines, and the like.

Based on the return data returned at block 6006, orchestrator 110 can proceed to block 6008. At block 6008, orchestrator 110 can virtually reprovision and digitally adjust a configuration for the target computing environment currently being evaluated for provisioning in dependence on the returned adjustment data returned at block 6006. In one embodiment, the returned output data returned at block 6006 can specify infrastructure parameter values and virtualization parameter values as candidate reprovisioning parameter values. At block 6008, orchestrator 110 for digitally adjusting a target computing environment can virtually reprovision the target computing environment using the described candidate reprovisioning parameter values. Virtually reprovisioning a target computing environment can include, e.g., adding infrastructure and/or virtualization components determined by comparing the configuration data for the return system returned at block 6006 for the configuration data of the current target computing environment being evaluated for provisioning at block 6008. The digital adjustment virtual reprovisioning data at block 6008 can comprise such adjustment reprovisioning parameter values, for example, as: "add N computing nodes of type X" and "add M virtual machines of type Y", according to one example.

With the target computing environment virtually reprovisioned using candidate reprovisioning parameter values returned at block 6006, orchestrator 110 can proceed to block 6010. At block 6010, orchestrator 110 can identify matching computing environments of computing environments 120A-120Z having a threshold satisfying level of similarity with the virtually reprovisioned target computing environment virtually reprovisioned using candidate reprovisioning parameter values.

For comparing computing environments for similarity, orchestrator 110 at block 6010 can utilize values of various parameters as stored in computing environment parameters history area 2121, such as infrastructure parameter values and virtualization parameter values.

Figure 8:
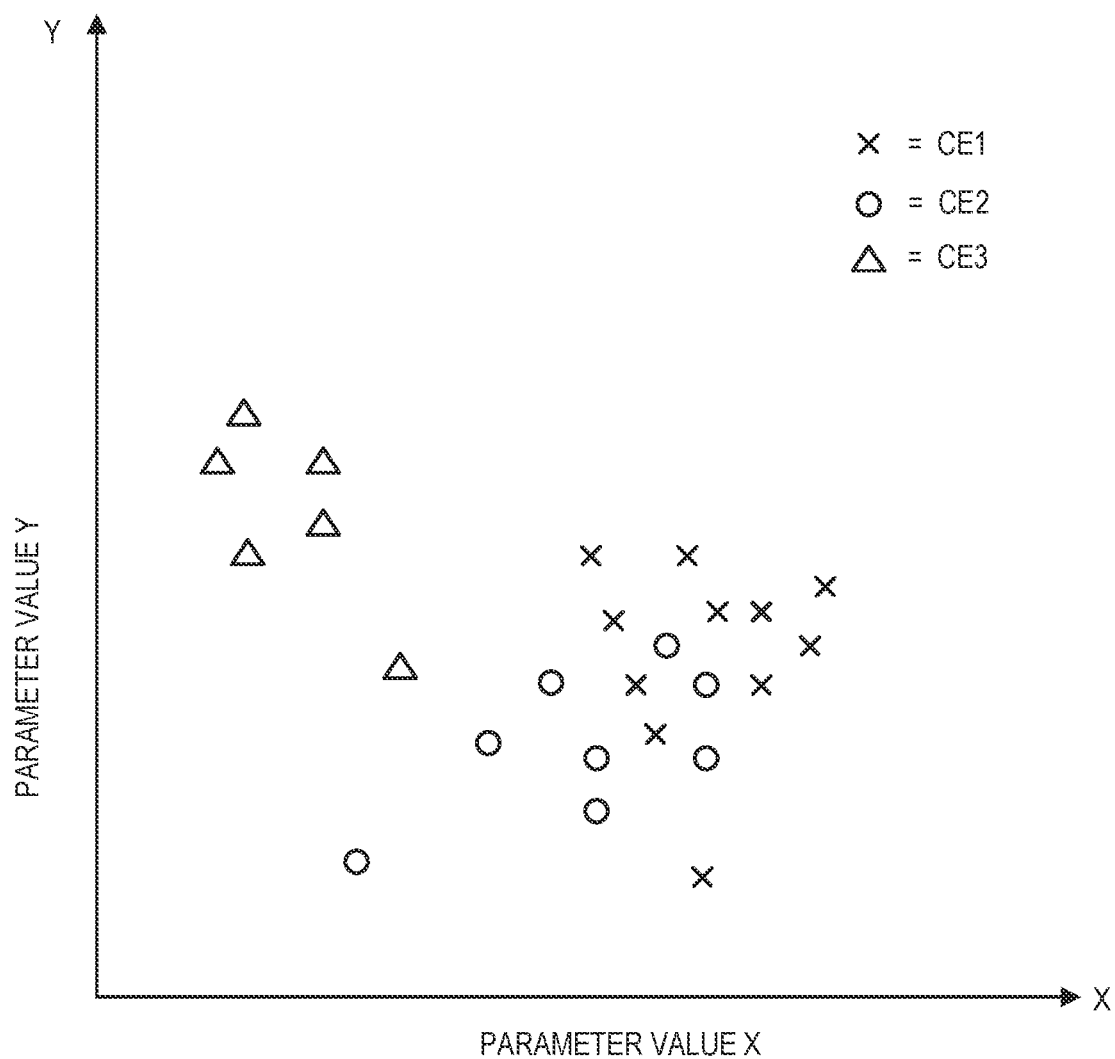
FIG. 8 depicts a clustering analysis method for performance of an orchestrator according to one embodiment.

Similarities between computing environments can be determined using clustering analysis as described with reference to FIG. 8. An example of clustering analysis is depicted in FIG. 8 wherein observations associated to first, second, and third computing environments are shown with the X indicators being observations associated to a target computing environment, the circle indicators being observations associated to a candidate similar computing environment, and the triangle indicators being observations associated to a second candidate similar computing environment. The observations depicted in the simplified embodiment of FIG. 8 can be vectors that specify values of first and second computing environment characterizing parameters, e.g., physical computing node CPU capacity and memory capacity for example, or any other set of first and second computing environment characterizing parameter values expressed in terms of amplitude. The different observations associated to the respective computing environment subject to clustering analysis can be observations per computing node in the example described or for other computing environment parameter values observations accumulated over time, e.g., within a time window of a current time.

Referring to FIG. 8, it can be seen that orchestrator 110 employing clustering analysis in which aggregate Euclidean distances are accumulated and analyzed can ascertain that the first candidate similar computing environment has a higher degree of similarity to the target computing environment than the second candidate similar computing environment, and, based on an additional one or more criterion, can determine that the first candidate test computing environment has a level of similarity to the target computing environment that is within a threshold level. FIG. 8 depicts a clustering analysis performed using first and second observations. Clustering analysis, in another embodiment, can be scaled up to N dimensions, e.g., the N dimensions defined by the multiple computing environment characterizing parameters set forth in reference to computing environment parameters history area 2121 of data repository 108 as shown in FIG. 1A. Embodiments herein recognize that with a deployment of tens, hundreds, thousands, or even millions of edge computing environments, and wherein the various edge computing environments can include relatively small numbers of virtualization of infrastructure and virtualization elements, numerous different geospatially spaced apart computing environments over a geographical area can exhibit a threshold satisfying level of similarity.

On completion of block 6010, orchestrator 110 can proceed to block 6012. At block 6012, orchestrator 110 can discover simulation scenarios for testing the virtually reprovisioned target computing environment virtually reprovisioned with returned data returned at block 6006 with respect to special use cases such as boundary condition simulation scenarios.

For discovering simulation scenarios at block 6012, orchestrator 110 can search computing environment parameters history area 2121 for instances in which computing environments of computing environments 120A-120Z reach saturation, meaning that the computing environment exhibited zero availability for a certain utilization parameter, where availability is determined based on a proportion of utilization to capacity. For identifying simulation scenarios at block 6012, orchestrator 110, in one embodiment, can limit its search to computing environments having, as determined at block 6010, a threshold similarity with the virtually reprovisioned target computing environment virtually reprovisioned at block 6008.

For the identification of border conditions, e.g., saturation conditions at block 6012, orchestrator 110 can record computing environment parameter values associated to the border condition, e.g., weather pattern parameter values, social event parameter values, and other utilization parameters such as concurrent user's parameter values. At block 6014, orchestrator 110 can run the identified simulation scenarios using a computing environment predictive model 3002 associated to the identified matching computing environment predictive model identified as matching the virtually reprovisioned target computing environment identified at block 6010 virtually reprovisioned using candidate returned parameter values returned at block 6006. Running a simulation scenario, block 6014 can include applying as query data to the identified CE predictive model 3002 associated to the identified matching computing environment with query data that comprises computing environment characterizing parameter values associated with the boundary condition, such as number of concurrent users, weather event data, social event data, and the like.

On the application of query data, predictive model 3002 at block 6014 selected for test of a simulation scenario to which the query data is applied can return output data that specifies predicted computing environment characterizing parameter values such as availability utilization parameter values. At block 6016, orchestrator 110 can ascertain, based on the return output data returned at block 6014, whether the virtually reprovisioned target computing environment has passed the simulation scenario applied at block 6014. The determination of whether the virtually reprovisioned target computing environment has passed can include ascertaining whether the predicted data output at block 6014 that predicts based on the query data that availability for one or more utilization parameter value will be zero under the applied conditions specified by the query data.

If on the determination at block 6010 that the virtually reprovisioned target computing environment has not passed the applied simulation, orchestrator 110 can return back to block 6018 to digitally adjust and virtually reprovision the target computing environment again, e.g., by adding one or more additional computing node and/or one or more additional virtual machine to the target computing environment. Orchestrator 110 can then iteratively perform the loop of blocks 6008 to 6016 until the virtually reprovisioned target computing environment passes the simulation scenario test at block 6016.

In the case at block 6010 that no matching computing environment is identified, orchestrator 110 at subsequent iterations of blocks 6012 and 6014 can continue to use the CE predictive model 3002 associated to the target computing environment without digital adjustment and can apply a biasing factor for biasing utilization parameter values returned by querying of the CE predictive model 3002, wherein the biasing parameter values are determined using predetermined scaling tables stored in decision data structures area 2124 that biases utilization parameters in a predetermined manner based on increased infrastructure and/or virtualization assets.

On the determination by orchestrator 110 at block 6016 that a target computing environment has passed the applied simulation scenario applied at 6014, orchestrator 110 can proceed to block 6018.

At block 6018, as indicated by send block 1106 in the flowchart of FIG. 2, orchestrator 110 can send provisioning data to the target computing environment of computing environments 120A-120Z and that target computing environment at provisioning block 1302 can be reprovisioned according to the provision data, e.g., by adjustment of a count of computing nodes, adjustment of computing node types, adjustment of virtualization parameter values expressed, e.g., by increases in numbers (a count) of virtual machines, adjustment of virtual machine types, and/or adjustment of virtual machine resource provisioning.

At block 6020, orchestrator 110 can train a CE predictive model 3002 for the newly reprovisioned computing environment at block 6020. The new training data can include training data made available after the time of the reprovisioning wherein the computing environment has new infrastructure and/or virtualization elements. The training of the predictive model for the target computing environment, e.g., computing environment 120A, can include training the CE predictive model 3002 associated to computing environment 120A using current, i.e., most recent computing environment parameter values as returned at send block 1301 (FIG. 2) to orchestrator 110.

On the application of the training data, orchestrator 110 at block 6022 can ascertain whether the newly trained CE predictive model 3002 associated to computing environment 120A (which can be a target computing environment in the described scenario) exhibits a threshold satisfying level of accuracy. For performance of block 6022, orchestrator 110, with respect to the CE predictive model 3002 associated to computing environment 120A for predicting behavior of the target computing environment 120A, can compare predicted output data with reference to holdout data. When the output predictive data output by the CE predictive model 3002 for computing environment 120A matches the holdout data within a threshold satisfying degree level of accuracy, orchestrator 110 can proceed to block 6024.

At block 6024, orchestrator 110 can run the simulation scenarios discovered at block 6002 using the trained CE predictive model 3002 for the target computing environment 120A subject to infrastructure and/or virtualization parameter value adjustment at provisioning block 6018. At block 6026, orchestrator 110, in the manner described with reference to block 6016, can determine whether the target computing environment 120A passes the simulation scenario test, e.g., using border condition processing as described with reference to 6014 and 6016. On the determination that the newly reprovisioned target computing environment 120A does not pass the test, orchestrator 110 can return to block 6018 and can iteratively perform the loop of blocks 6008-6026 until orchestrator 110 identifies a passing condition.

On the determination at block 6026 that the newly provisioned target computing environment passes the simulation scenario test run at block 6024, orchestrator 110 can proceed to block 6028. At block 6028, orchestrator 110 can return to block 6002 in order to perform the next iteration of ascertaining SLA requirements as recently updated and at block 6004 discovering growth trends as described previously in connection with block 6004. Orchestrator 110 can iteratively perform the loop of blocks 6002-6028 during a deployment period of system 100.

In the sending of provisioning data at block 1106, orchestrator 110 can ascertain provisioning parameter values associated to sensors of the newly configured computing environment configured differently with the provisioning data.

Figure 5A:
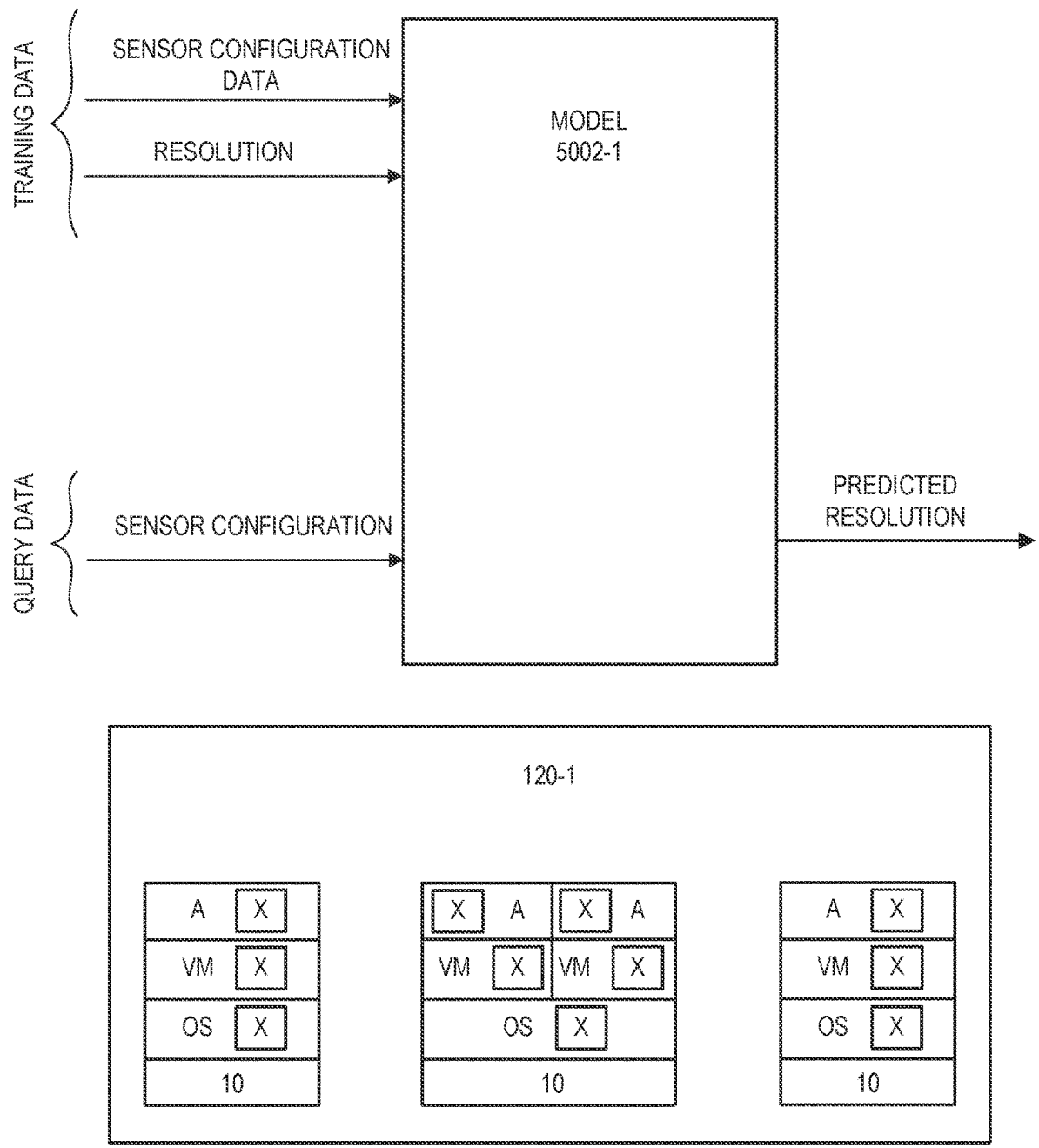
FIGS. 5A-5C depict various classifications for computing environments and associated predictive models for predicting sensor behavior within such computing environments according to one embodiment.
Figure 5B:
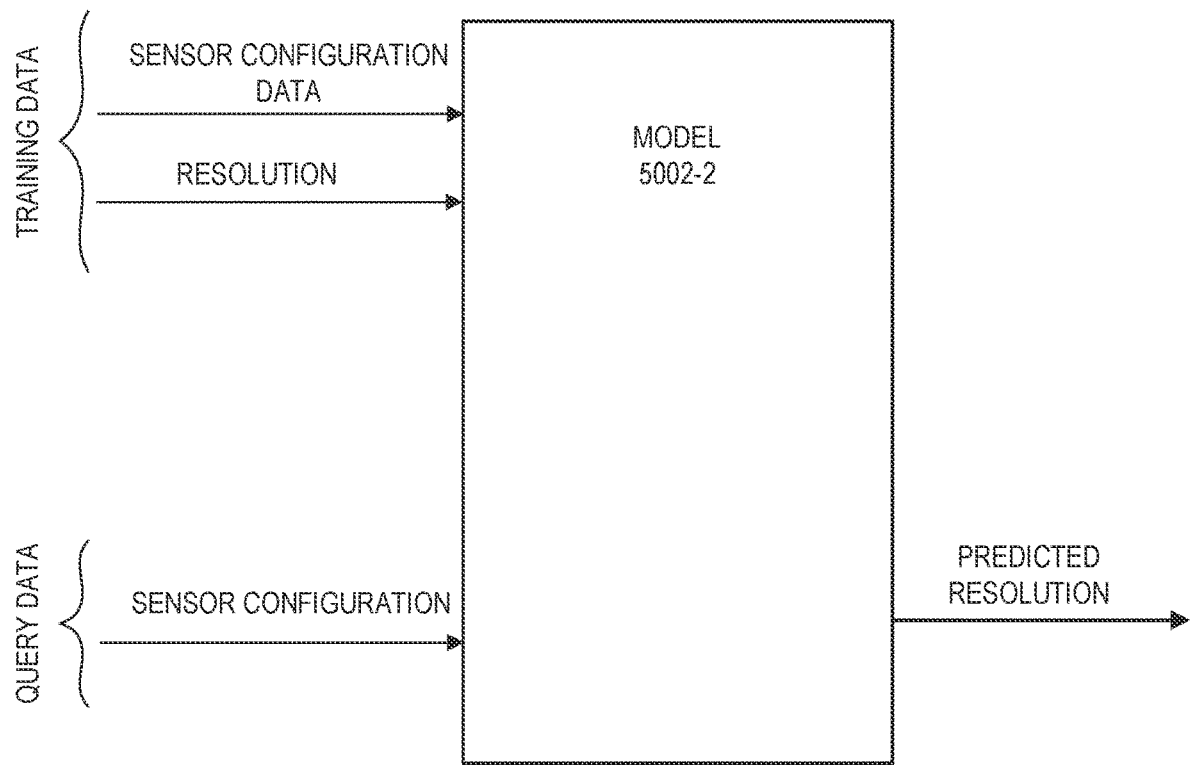
Figure 5B:
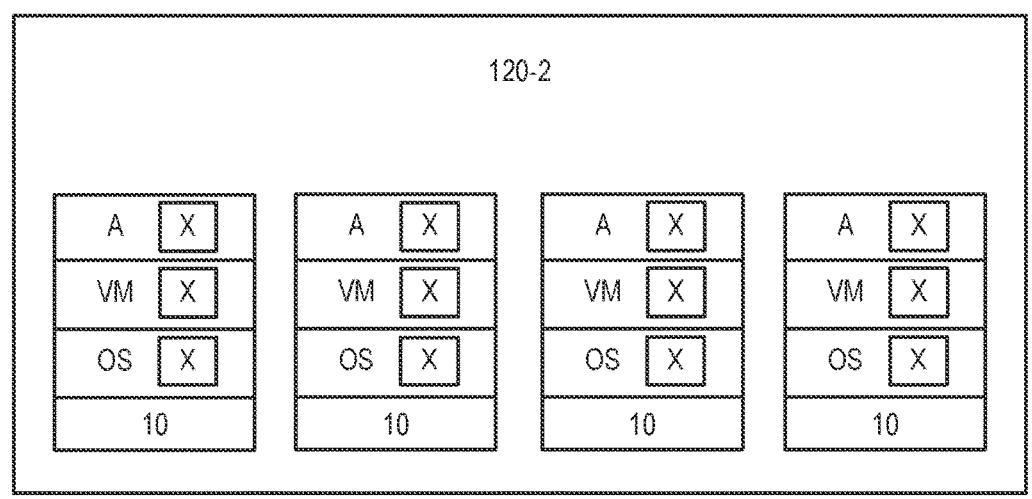
Figure 5C:
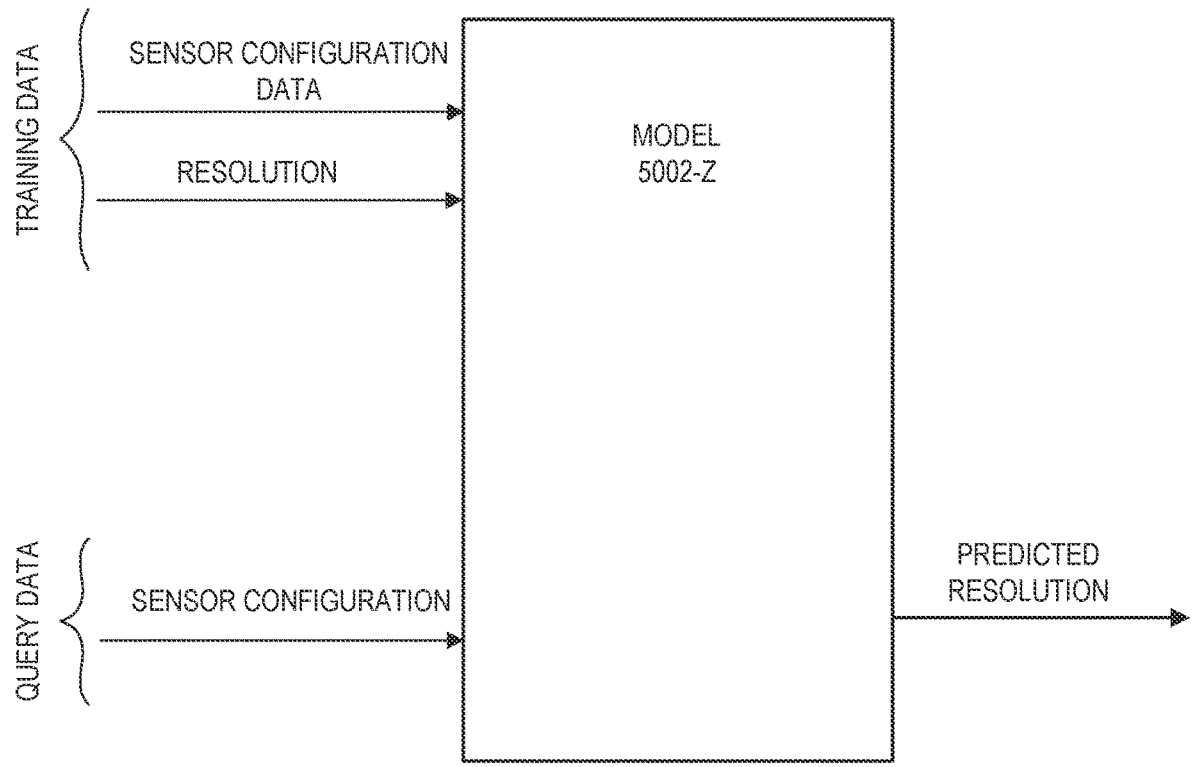
Figure 5C:
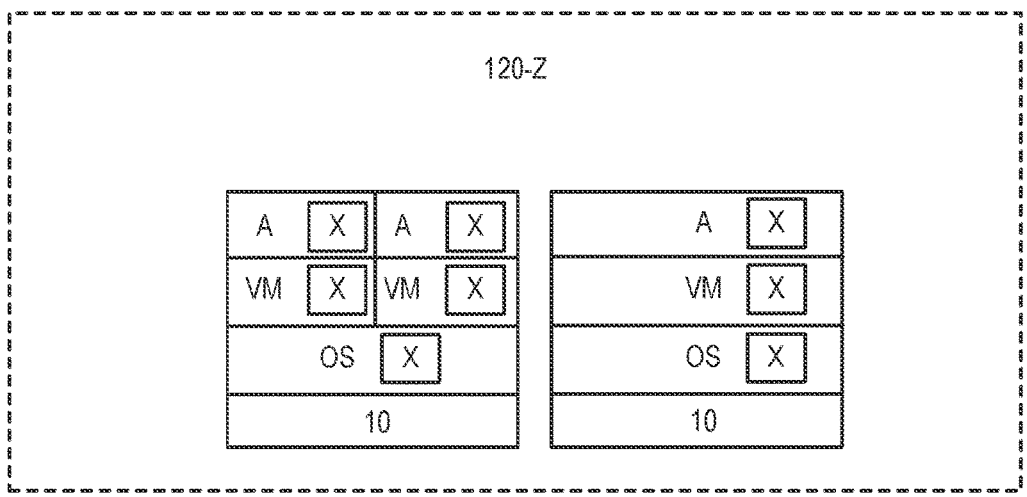

For predicting the sensor integration to be performed with the provisioning data to be carried out at block 1302 by a target computing environment, orchestrator 110 at action decision block 1105 can query the predictive models as are shown in FIGS. 5A-5C.

At block 1106, orchestrator 110 can send provisioning data that specifies adjustments in sensor distribution of a computing environment, wherein sensors are disposed for the obtaining of utilization parameter values. On receipt of the provisioning data, a target computing environment at block 1302 can perform provisioning to adjust the sensor distribution within a target computing environment in accordance with the received provisioning data. In one aspect, SLA data for a certain computing environment can specify sensor resolution requirements which specify the level of resolution required of sensor output data indicating a utilization parameter value.

The method by which orchestrator 110 can provision a sensor distribution in a target computing environment is described with reference to FIGS. 5A-5C. As shown in FIGS. 5A-5C, orchestrator 110 can establish, by simulation, multiple different computing environment configurations, each computing environment having a different configuration for infrastructure parameter values and virtualization parameter values. In FIG. 5A, for example, there is a computing environment with three computing nodes in a certain arrangement of virtual machines. In FIG. 5B, there is shown a configuration with four computing nodes in a second arrangement of virtual machines, and in FIG. 5C, there is a computing environment with two computing nodes and a third arrangement for virtual machines. Sensors in the various computing environment configurations of FIGS. 5A-5C are indicated with the reference character "X". In FIGS. 5A-5C, there is indicated a sensor integrated at full distribution level with a sensor disposed with respect to each OS, each VM, and each application within a computing environment. The described sensors set forth in reference to FIGS. 5A-5C can be provided by software agents that communicate with a primary program located within manager node 121 of a computing environment.

Based on the full distribution of sensors shown in FIGS. 5A-5C, the described full distribution of sensors can be expected to output full resolution utilization parameter values, e.g., infrastructure utilization parameter values or network utilization parameter values. While full-scale distribution of sensors can be expected to provide full resolution sensor output data in the form of computing environment infrastructure utilization parameter values and/or network utilization parameter values, embodiments herein recognize that SLA data for a particular computing environment can specify that less than full resolution sensor data output can be sufficient.

For predicting an output sensor resolution in dependence on sensor configuration data, i.e., configuration data that specifies a sensor distribution within a computing environment, orchestrator 110 can train a predictive model. Orchestrator 110, as shown in FIGS. 5A-5C, can train for each respective computing environment a different predictive model, wherein the predictive model can be trained to predict an output sensor resolution in dependence on a sensor configuration. While a full distribution sensor configuration can be expected to output a sensor resolution at full resolution, sensor distribution configurations with less than full distribution can be expected to output sensor data with less than full-scale resolution.

Referring to model 5002-1 as shown in FIG. 5A, model 5002-1 can be trained with iterations of training data and once trained, model 5002-1 can be configured to respond to query data. The iterations of training data for training model 5002-1 can include iterations of sensor configuration data with return resolution data. Return resolution data can be expressed as a percentage of resolution with respect to a full-scale resolution of sensor output data. The input sensor configuration data for each iteration can specify sensor distribution that is less than full-scale distribution. Trained as described, model 5002-1 can learn a relationship between sensor distribution configurations and their associated resolution, and once trained, model 5002-1 can be configured to predict a sensor output resolution associated to any arbitrary sensor configuration where the sensor configuration can range from a full distribution sensor configuration as shown in FIGS. 5A-5C down to a configuration having a sparse distribution of sensors which can result in sensor output data of lower resolution. Models 5002-2 and 5002-Z associated respectively to computing environments 120-2 and 120-Z in FIGS. 5B and 5C can be trained in the manner of model 5002-1.

For establishing sensor configuration parameter values for sending with provisioning data, including with provisioning data sent at block 1106 (FIG. 2), orchestrator 110 can obtain most recent SLA data from SLA repository 2122 for the target computing environment in order to ascertain any sensor resolution requirements specified within the SLA data. Orchestrator 110 can then query one of models 5002-1 to 5002-Z in order to ascertain whether the return predicted resolution predicted using the queried model will be sufficient to satisfy the sensor resolution specified in the return SLA data. In order to select which of the predictive models 5002-1 to 5002-Z to query, orchestrator 110 can apply clustering analysis as set forth in reference to FIG. 8 in order to select a computing environment classification of computing environment classifications 120-1 to 120-Z having closest similarity to the current virtually reprovisioned target computing environment being evaluated at action decision block 1105 based on smallest Euclidean distance. Orchestrator 110 can select for querying the predictive model of predictive models 5002-1 to 5002-Z associated to the selected computing environment classification. The training data for training models 5002-1 to 5002-Z can be live training data derived from a physical computing environment or simulation data derived by running a simulation in which operation of a computing environment has been simulated.

Orchestrator 110 at action decision block 1105 can query a selected one of predictive models 5002-1 to 5002-Z in order to determine whether the current sensor distribution for the virtually reprovisioned target computing environment virtually reprovisioned at block 6008 is sufficient for the virtually reprovisioned target computing environment.

If the predicted resolution predicted using the selected predictive model of FIGS. 5A-5C is less than the resolution required as per the SLA data associated to the target computing environment, orchestrator 110 can iteratively digitally increase the sensor distribution configuration for the target computing environment and can iteratively predict the resolution with each digital adjustment. Orchestrator 110 can continue with the iterative adjustment of sensor distributions and examining of return predicted resolutions until a satisfactory resolution is achieved. At that time point, orchestrator 110 can establish the most recent iteration of sensor distribution configuration data as the selected sensor distribution configuration data for the target computing environment and can include the selected sensor distribution configuration data for sending within the provisioning data sent at block 1106 so that at provisioning block 1302 (FIG. 2), the target computing environment upgrades and adjusts the sensor distribution of the target computing environment according to the selected sensor distribution configuration data.

For provisioning of an adjusted sensor configuration, manager node 121 of the target computing environment can send appropriate software installation packages to appropriate ones of computing node operating systems, VMs, and applications within the target computing environment of computing environments 120A-120Z so that appropriate sensor agents for communication of sensor output data, e.g., in the form of utilization parameter values are appropriately reported back to manager node 121 on an iterative basis for storage of utilization parameter values into data repository 122 and iterative reporting to data repository 108 of orchestrator 110.

At return block 1303, computing environments 120A-120Z can return to a block preceding block 1301 to receive additional parameter request data. At return block 1107, orchestrator 110 can return to a stage preceding block 1102 to send additional parameter request data. Orchestrator 110 can iteratively perform the loop of blocks 1102 to 1107 while iteratively performing the loop of block 1101. Computing environments 120A-120Z can iteratively perform the loop of blocks 1301-1303. On completion of provisioning at block 1302, and in return of parameter return data at block 1301 in a next iteration, orchestrator 110 can proceed to a next iteration of training at block 1103, which corresponds to block 6020 in the flowchart of FIG. 6.

Figure 9:
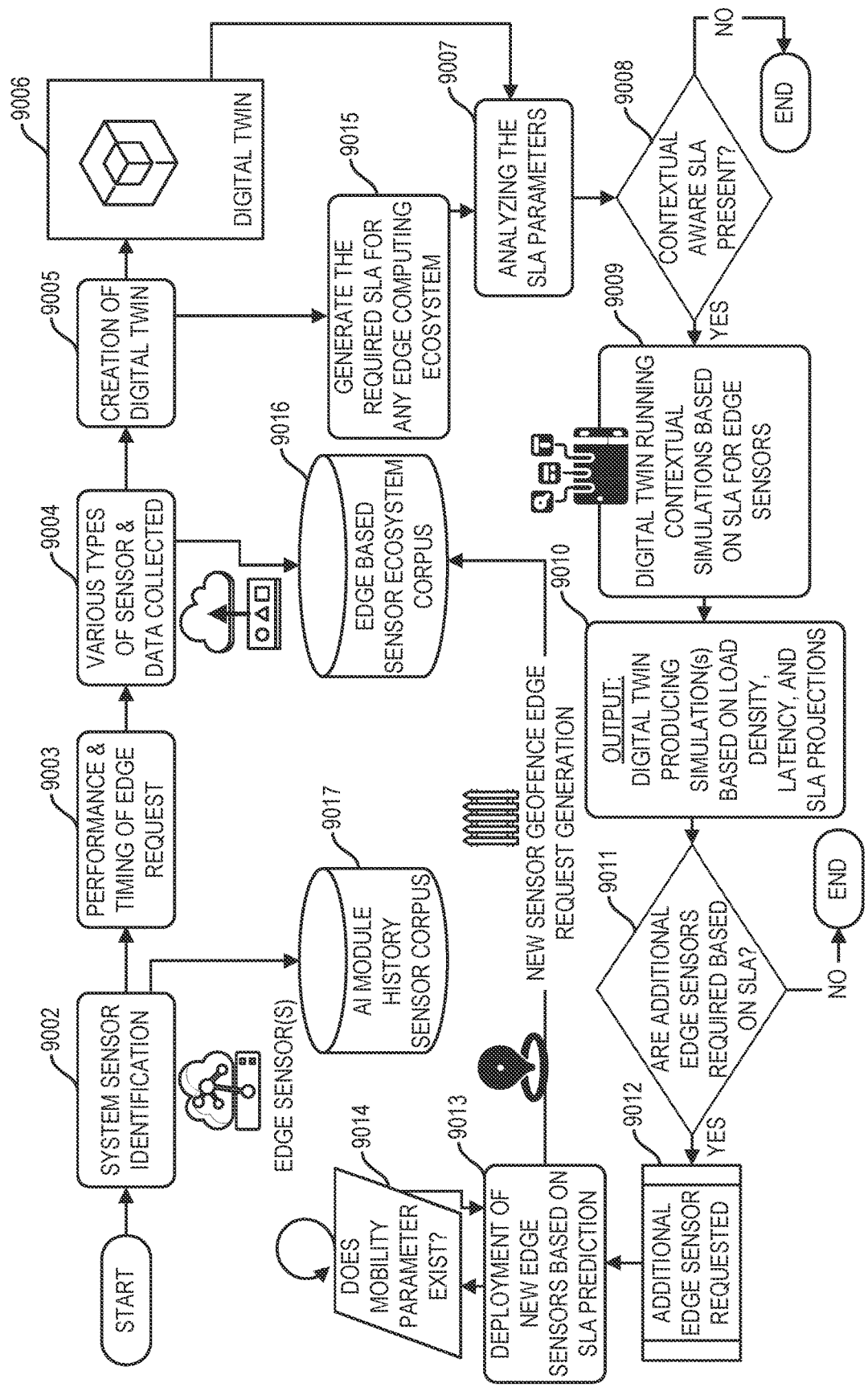
FIG. 9 is a flowchart depicting a method for performance by an orchestrator according to one embodiment.

Additional aspects of system 100 in reference to blocks 9001-9017 are shown in the flowchart of FIG. 9. As shown in FIG. 9, a digital twin 9006 can be provided for the generation of predictions, which digital twin 9006 can be provided by a combination of models set forth with respect to models area 2123 of data repository 108. As indicated by block 9010 of the flowchart of FIG. 9, digital twin 9006 can produce and test simulations in dependence on historical data stored within computing environment parameters history area 2121.

Embodiments herein can provide an artificial intelligence (AI) based method and system by which edge computing environments can dynamically be updated with new configurations including new sensor configurations to gather data and computing resources to process the gathered data to support a specific number of edge computing requests as per a defined service level agreement. The new sensor configurations can include, e.g., software-based sensors as provided by primary-agent sensors for providing key performance indicator (KPI) metrics data provided by, e.g., utilization parameter values and, in some embodiments, required types of hardware sensors including of T sensors.

Embodiments herein recognize that edge computing is a distributed computing paradigm that brings computation and data storage closer to the location where it is used to improve response latency times and save bandwidth. Edge computing can be used to process time-sensitive data. Cloud computing can be used to process data that is not time-driven. Besides response latency, edge computing can be preferred over cloud computing in remote locations where there is limited or no connectivity to a centralized location.

Embodiments herein recognize that in any given edge computing ecosystem there can be different types of sensors generating different types of data. At the same time, the edge computing environment can also include computing resources for storing and processing that data.

Embodiments herein recognize that an SLA can specify not only description of the services to be provided and their expected service levels, but also the metrics by which the services are to be measured, the duties and responsibilities of each party, the remedies or penalties for a breach, and the protocol for adding and removing metrics. In one aspect, metrics can be designed so that bad behavior by either party is not rewarded. For example, if a service level is breached because the client did not provide information in a timely manner, the supplier should not be penalized.

An SLA in any edge computing environment can dictate performance level, required analysis of datasets, and data types, etc. Embodiments herein can provide correct computing resources and correct types of sensors at the edge location required to support the SLA and rendered services to meet the specified SLA requirements; otherwise, required service level will not be achieved.

Embodiments herein can provide a method and system by which an edge computing ecosystem can dynamically be updated or created based on a defined service level agreement and predicted characteristic of the computing environment, e.g., number of users that can be supported in that edge computing environment and other predicted utilization parameter value.

On one embodiment, there can be performed simulation of a given edge computing environment using an AI enabled digital twin computing system against defined service level agreement (SLA) and with use of the performance of several service level indicators (SLIs) to identify specific modifications that are required to meet the terms of the defined service level agreement.

Based on the digital twin simulation, embodiments herein can be identifying current capability from the instantaneous performance versus the trend of the several component metrics (e.g., provided by SLIs) in each of the said edge computing ecosystem and what types of services and processing latency can be achieved.

The digital twin simulation engine can be evaluating defined service level agreement, compared to the performance of the several SLI types (availability, latency, throughput, error rate, etc.) and accordingly can be identifying how any existing edge computing ecosystems can be modified to provide support to required number of requests within any defined timeline, and that the edge computing ecosystem can be modified.

The SLA for any edge computing environment can vary because of change in contextual situation. The digital twin computing system can be simulating various contextual situations with the defined SLA, and accordingly can be identifying what configuration is to be created in computing resources and in the sensors, so that required SLA is achieved in different contextual scenarios.

When any new edge computing environment is to be created, then based on defined SLA and geofencing boundary of the edge computing ecosystem, embodiments herein can be recommending how the computing resources and sensors can be deployed and the SLI that will give a true representation of their performance envelope.

An edge computing ecosystem can also be mobile. The digital twin computing system can be considering the defined service level agreement, mobility parameters (like speed and direction etc.), and accordingly be recommending how the said mobile edge computing environment ecosystem is to be updated or configured for the required level of SLA.

An AI enabled digital twin simulation engine can be evaluating any edge computing environment based on a given context aware SLA, and accordingly can be recommending what changes are to be applied in the said edge computing environment.

In any edge computing ecosystem, each and every sensor can be identified uniquely, and a specification of each and every sensor will also be identified historically be gathering. An embodiment herein can be obtaining parameter values from each and every edge computing environment of a system. Performance of an edge computing ecosystem can be measured, e.g., in terms of a number of requests received, data processing time, latency in data processing per unit time, and the number of requests that are satisfied, etc.

Different types of sensor feeds can generate different types of data and these different sensors can be providing different types of analysis outcome. Embodiments herein can be receiving data from different edge computing ecosystems and accordingly can be creating knowledge corpus about the edge computing ecosystem. Embodiments herein can feature a digital twin computing system and the said digital twin computing system can be used for simulating any edge computing ecosystem. The described digital twin can be provided, e.g., by a computing environment predictive model herein, a combination of such predictive models, a global computing environments predictive model, and/or one or more predictive model for predictive sensor performance.

Embodiments herein can include obtaining SLA data for any edge computing environment that is to be updated or created. An AI enabled digital twin computing system can be analyzing SLA parameter values and the same can be evaluated against the given edge computing environment. In the described scenario, SLA can also be context aware. For different contextual situations, there can be different types of SLAs.

Embodiments herein can be analyzing different contextual situations and can be identifying the SLA associated to the context. If any given edge computing environment is to be evaluated, embodiments herein can be receiving the detail from the given edge computing environment.

A digital twin computing system can be identifying each and every configuration, computing resources, sensor, and geofencing area around which the edge computing ecosystem is created, etc. Based on the defined SLA and the edge computing environment, the digital twin computing system can be performing a simulation. During simulation, the digital twin computing system can be creating various scenarios, and accordingly, the same can be evaluated against the SLA.

Embodiments herein can be identifying the gap, and accordingly, embodiments herein can be identifying what modification is required in a given edge computing environment.

The digital twin computing system can be identifying the number of requests that can be supported and latency in data processing, etc. The digital twin simulation engine can be identifying what computing resources are to be deployed and what additional sensors are to be deployed.

If a new edge computing environment is to be created, then embodiments herein can be receiving the geofencing area, receiving the SLA, and accordingly be designing how the edge computing environment is to be created. If the edge computing environment is mobile, then embodiments herein can be considering the mobility parameter of the edge computing ecosystem and will be comparing the same with SLA. Embodiments herein can be recommending any changes in the mobile edge computing ecosystem.

There is set forth herein a computer enabled system and method for modifying a computing ecosystem utilizing a digital twin and edge computing analysis to meet service level agreements, the method comprised of, identifying the SLA goals (e.g., service level objective (SLO)) that must be maintained, predicting if an SLO is going to be missed based on current state, generating a digital twin to analyze impacts to the changes in the environment, determining impacts to modifications that can be made to meeting the SLA, and initiating modifications to the environment to improve SLA-attainment. There is set forth herein the described method comprised of identifying via natural language processing or manual entry and metrics that can be used to determine agreed service level. There is set forth herein the described method further comprised of building a digital twin comprised of all current hardware, software, and workload. There is set forth herein the described method further comprised of comparing historical throughput to current throughput and historical results. There is set forth herein the described method further comprised of determining if the predicted service level attainment will meet or exceed the determined attainment requirements. There is set forth herein the described method further comprised of analyzing current volumes with historical volumes and current environment with historical environment to determine if modifications to the environment will allow for meeting at risk SLA. There is set forth herein the described method further comprised of determining all possible combinations of modifiable environmental factors such as storage, memory, and CPU capacity. The method can be further comprised of initiating changes to the physical environment required to meet the agreed to service level. An AI based method and system is proposed by which edge computing ecosystems will dynamically be updated with required types of IoT sensors to gather data and computing resources to process the gathered data to support a specific number of edge computing requests as per the defined service level agreement. Simulation of a given edge computing ecosystem using an AI enabled digital twin computing system against defined service level agreement (SLA) using the performance of several Service Level Indicators (SLIs) to identify specific modifications are required to meet the terms of the defined service level agreement. Based on the digital twin simulation of any edge computing surrounding the proposed system will be identifying current capability from the instantaneous performance vs the trend of the several component metrics or SLIs in each of the said edge computing ecosystem and what types of services and processing latency can be achieved. The digital twin simulation engine will be evaluating defined service level agreement, compared to the performance of the several SLI types (availability, latency, throughput, error rate, etc.) and accordingly be identifying how any existing edge computing ecosystem can be modified to provide support to required number of requests within any defined timeline, and that the edge computing ecosystem can be modified. The SLA for any edge computing ecosystem can vary because of changes in contextual situation. The digital twin computing system will be simulating various contextual situations with the defined SLA, and accordingly be identifying what configuration is to be created in the sensors and computing resources, so that required SLA is achieved in different contextual scenarios. When any new edge computing ecosystem is to be created, then based on defined SLA and geofencing boundary of the edge computing ecosystem, the proposed system will be recommending how the sensors and computing resources are to be deployed and the SLI that will give a true representation of their performance envelope. The edge computing ecosystem can also be mobile. The digital twin computing system will be considering the defined service level agreement, mobility parameters (like speed and direction, etc.) and accordingly be recommending how the said mobile edge computing ecosystem is to be updated or configured for required level of service.

Various available tools, libraries, and/or services can be utilized for implementation of predictive models herein. For example, a machine learning service can provide access to libraries and executable code for support of machine learning functions. A machine learning service can provide access set of REST APIs that can be called from any programming language and that permit the integration of predictive analytics into any application. Enabled REST APIs can provide e.g., retrieval of metadata for a given predictive model, deployment of models and management of deployed models, online deployment, scoring, batch deployment, stream deployment, monitoring and retraining deployed models. According to one possible implementation, a machine learning service provided by IBM® WATSON® can provide access to libraries of APACHE® SPARK® and IBM® SPSS® (IBM® WATSON® and SPSS® are registered trademarks of International Business Machines Corporation and APACHE® and SPARK® are registered trademarks of the Apache Software Foundation. A machine learning service provided by IBM® WATSON® can provide access set of REST APIs that can be called from any programming language and that permit the integration of predictive analytics into any application. Enabled REST APIs can provide e.g., retrieval of metadata for a given predictive model, deployment of models and management of deployed models, online deployment, scoring, batch deployment, stream deployment, monitoring and retraining deployed models. Predict models herein can incorporate various machine learning technologies, e.g., neural networks, support vector machines (SVM), Bayesian networks, random forests, regression, curve fitting, and/or other machine learning technologies.

Certain embodiments herein may offer various technical computing advantages involving computing advantages to address problems arising in the realm of computer systems. Embodiments herein can employ a digital twin provided by one or more predictive model for predicting performance of a computing environment which can be provided by an edge network disposed computing environment. Embodiments herein can include iteratively obtaining updated SLA parameter service level agreement SLA parameter values and iteratively comparing such parameter values to output data output by a predictive model that predicts the behavior of a computing environment. By use of a predictive model for predicting the behavior of an edge computing environment, an orchestrator can proactively provision a target computing environment so that SLA requirements are proactively satisfied. Embodiments herein can employ regression analysis using historical data associated to a computing environment in order to predict subsequent future values of utilization parameters associated to a computing environment. The predicted utilization parameter values predicted with use of a regression analysis can be used to determine adjustments in infrastructure parameter values and virtualization parameter values associated to a computing environment. In one aspect, simulations can be run to test boundary conditions associated to a computing environment. Boundary conditions can be ascertained by an orchestrator examining historical data stored in a depository, wherein the historical data specifies conditions. In one embodiment, boundary conditions can be ascertained by identification of zero availability wherein a utilization level coincides with a capacity rating for an infrastructure parameter value or a network utilization parameter value. For predicting behavior of a target computing environment after it is subject to an infrastructure and/or virtualization parameter value adjustment, an orchestrator can identify within a systemwide distribution of computing environments a computing environment having a threshold-satisfying level of similarity with the virtually reprovisioned computing environment. The orchestrator, for testing the virtually reprovisioned target computing environment, can run simulation tests using a predictive model associated to the matching computing environment that matches the virtually reprovisioned target computing environment. Various decision data structures can be used to drive artificial intelligence (AI) decision making, such as decision data structure that cognitively maps social media interactions in relation to posted content in respect to parameters for use in better allocations that can include allocations of digital rights. Decision data structures as set forth herein can be updated by machine learning so that accuracy and reliability is iteratively improved over time without resource consuming rules intensive processing. Machine learning processes can be performed for increased accuracy and for reduction of reliance on rules-based criteria and thus reduced computational overhead. For enhancement of computational accuracies, embodiments can feature computational platforms existing only in the realm of computer networks such as artificial intelligence platforms, and machine learning platforms. Embodiments herein can employ data structuring processes, e.g., processing for transforming unstructured data into a form optimized for computerized processing. Embodiments herein can examine data from diverse data sources such as data sources that process radio signals for location determination of users. Embodiments herein can include artificial intelligence processing platforms featuring improved processes to transform unstructured data into structured form permitting computer-based analytics and decision making. Embodiments herein can include particular arrangements for both collecting rich data into a data repository and additional particular arrangements for updating such data and for use of that data to drive artificial intelligence decision making. Certain embodiments may be implemented by use of a cloud platform/data center in various types including a Software-as-a-Service (SaaS), Platform-as-a-Service (PaaS), Database-as-a-Service (DBaaS), and combinations thereof based on types of subscription.

Figure 10:
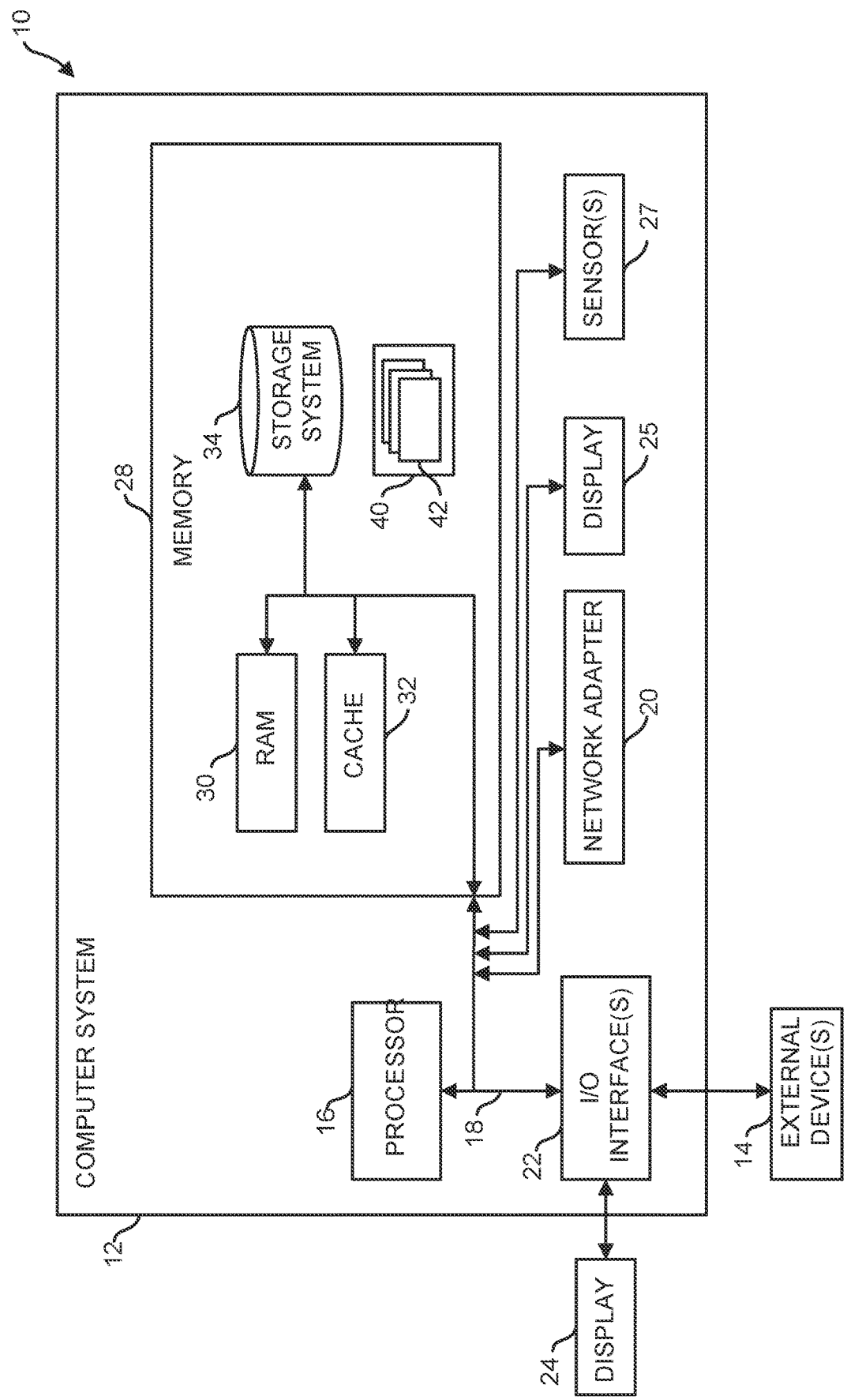
FIG. 10 depicts a computing node according to one embodiment.
Figure 11:
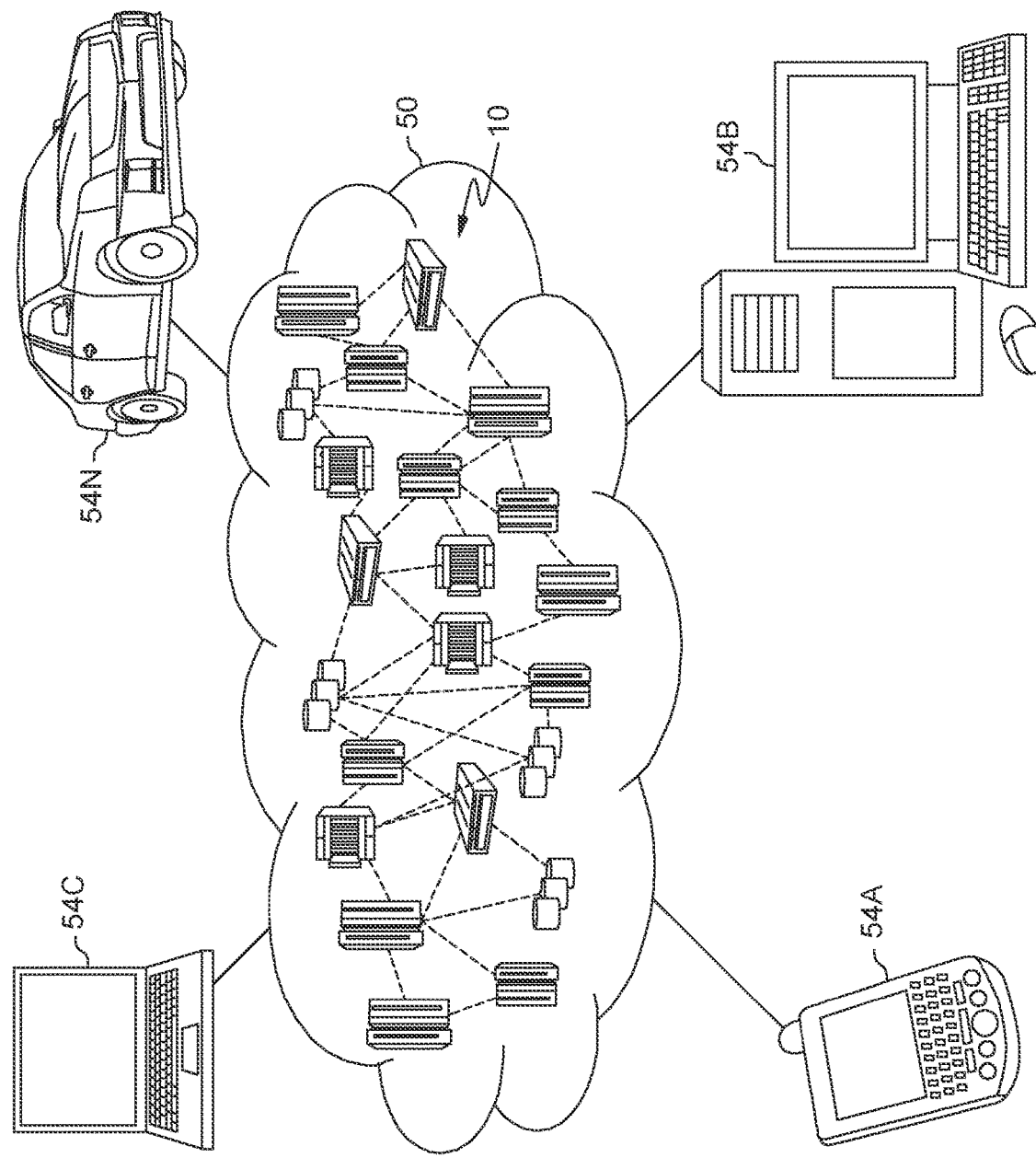
FIG. 11 depicts a cloud computing environment according to one embodiment.
Figure 12:
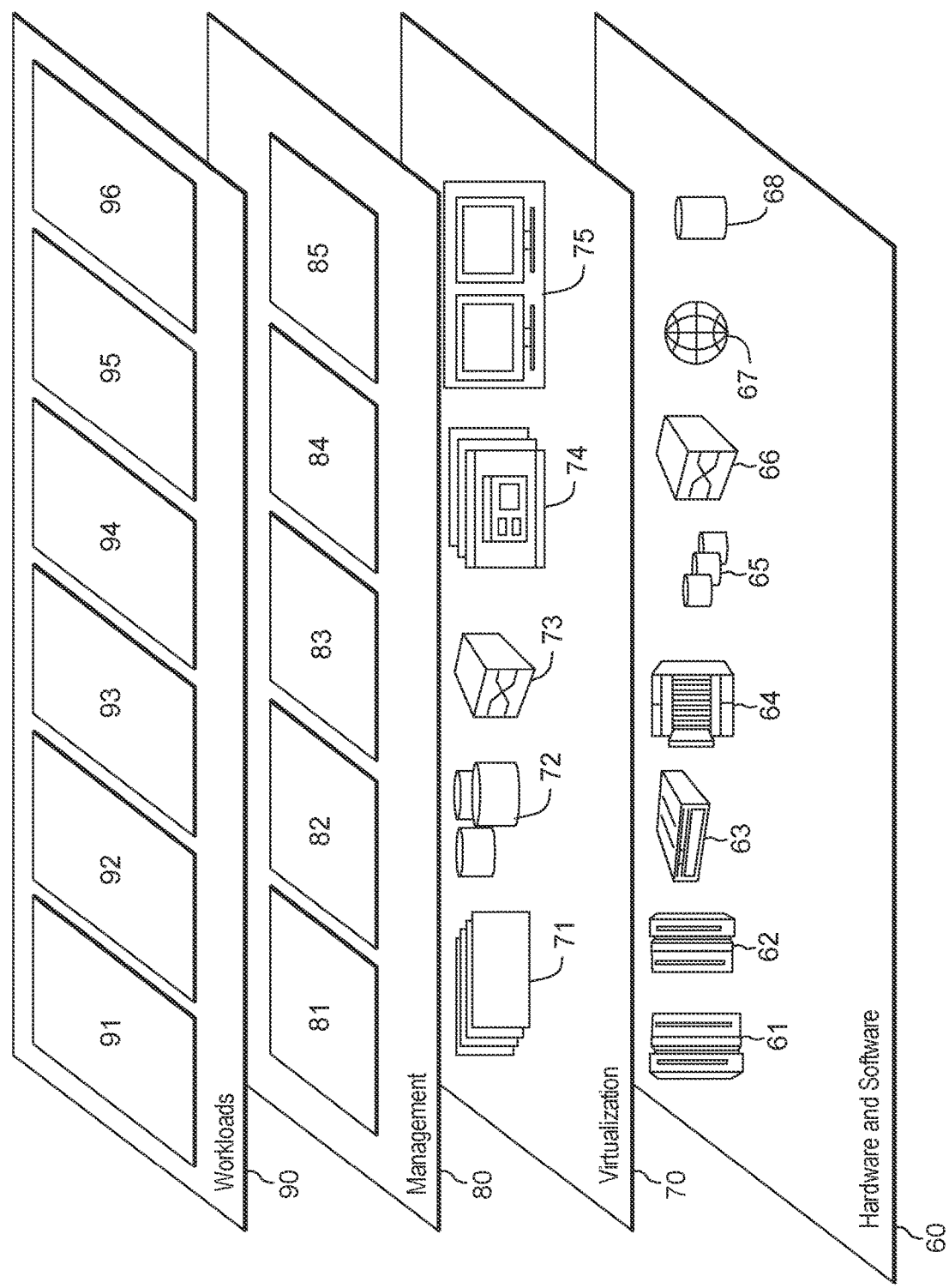
FIG. 12 depicts abstraction model layers according to one embodiment.

FIGS. 10-12 depict various aspects of computing, including a computer system and cloud computing, in accordance with one or more aspects set forth herein.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the services provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 10, a schematic of an example of a computing node is shown. Computing node 10 is only one example of a computing node suitable for use as a cloud computing node and is not intended to suggest any limitation as to the scope of use or functionality of embodiments of the invention described herein. Regardless, computing node 10 is capable of being implemented and/or performing any of the functionality set forth hereinabove. Computing node 10 can be implemented as a cloud computing node in a cloud computing environment or can be implemented as a computing node in a computing environment other than a cloud computing environment.

In computing node 10 there is a computer system 12, which is operational with numerous other general purpose or special purpose computing system environments or configurations. Examples of well-known computing systems, environments, and/or configurations that may be suitable for use with computer system 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 12 may be described in the general context of computer system-executable instructions, such as program processes, being executed by a computer system. Generally, program processes may include routines, programs, objects, components, logic, data structures, and so on that perform particular tasks or implement particular abstract data types. Computer system 12 may be practiced in distributed cloud computing environments where tasks are performed by remote processing devices that are linked through a communications network. In a distributed cloud computing environment, program processes may be located in both local and remote computer system storage media including memory storage devices.

As shown in FIG. 10, computer system 12 in computing node 10 is shown in the form of a computing device. The components of computer system 12 may include, but are not limited to, one or more processor 16, a system memory 28, and a bus 18 that couples various system components including system memory 28 to processor 16. In one embodiment, computing node 10 is a computing node of a non-cloud computing environment. In one embodiment, computing node 10 is a computing node of a cloud computing environment as set forth herein in connection with FIGS. 11-12.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 12 typically includes a variety of computer system readable media. Such media may be any available media that is accessible by computer system 12, and it includes both volatile and non-volatile media, removable and non-removable media.

System memory 28 can include computer system readable media in the form of volatile memory, such as random access memory (RAM) 30 and/or cache memory 32. Computer system 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program processes that are configured to carry out the functions of embodiments of the invention.

One or more program 40, having a set (at least one) of program processes 42, may be stored in memory 28 by way of example, and not limitation, as well as an operating system, one or more application programs, other program processes, and program data. One or more program 40 including program processes 42 can generally carry out the functions set forth herein. In one embodiment, orchestrator 110 can include one or more computing node 10 and can include one or more program 40 for performing functions described with reference to orchestrator 110 as set forth in the flowcharts of FIG. 2, FIG. 6 and FIG. 9. In one embodiment, computing environments 120A-120Z can include one or more computing node 10 and can include one or more program 40 for performing functions described with reference to computing environments 120A-120Z as set forth in the flowcharts of FIG. 2, FIG. 6 and FIG. 9. In one embodiment, one or more UE device 130A-130Z can include one or more computing node 10 and can include one or more program 40 for performing functions described with reference to one or more UE device 130A-130Z as set forth in the as set forth in the flowcharts of FIG. 2, FIG. 6 and FIG. 9. In one embodiment, the computing node based systems and devices depicted in FIGS. 1A and 1B can include one or more program for performing function described with reference to such computing node based systems and devices.

Computer system 12 may also communicate with one or more external devices 14 such as a keyboard, a pointing device, a display 24, etc.; one or more devices that enable a user to interact with computer system 12; and/or any devices (e.g., network card, modem, etc.) that enable computer system 12 to communicate with one or more other computing devices. Such communication can occur via Input/Output (I/O) interfaces 22. Still yet, computer system 12 can communicate with one or more networks such as a local area network (LAN), a general wide area network (WAN), and/or a public network (e.g., the Internet) via network adapter 20. As depicted, network adapter 20 communicates with the other components of computer system 12 via bus 18. It should be understood that although not shown, other hardware and/or software components could be used in conjunction with computer system 12. Examples, include, but are not limited to: microcode, device drivers, redundant processing units, external disk drive arrays, RAID systems, tape drives, and data archival storage systems, etc. In addition to or in place of having external devices 14 and display 24, which can be configured to provide user interface functionality, computing node 10 in one embodiment can include display 25 connected to bus 18. In one embodiment, display 25 can be configured as a touch screen display and can be configured to provide user interface functionality, e.g., can facilitate virtual keyboard functionality and input of total data. Computer system 12 in one embodiment can also include one or more sensor device 27 connected to bus 18. One or more sensor device 27 can alternatively be connected through I/O interface(s) 22. One or more sensor device 27 can include a Global Positioning Sensor (GPS) device in one embodiment and can be configured to provide a location of computing node 10. In one embodiment, one or more sensor device 27 can alternatively or in addition include, e.g., one or more of a camera, a gyroscope, a temperature sensor, a humidity sensor, a pulse sensor, a blood pressure (bp) sensor or an audio input device. Computer system 12 can include one or more network adapter 20. In FIG. 11 computing node 10 is described as being implemented in a cloud computing environment and accordingly is referred to as a cloud computing node in the context of FIG. 11.

Referring now to FIG. 11, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 11 are intended to be illustrative only and that computing nodes 10 and cloud computing environment 50 can communicate with any type of computerized device over any type of network and/or network addressable connection (e.g., using a web browser).

Referring now to FIG. 12, a set of functional abstraction layers provided by cloud computing environment 50 (FIG. 11) is shown. It should be understood in advance that the components, layers, and functions shown in FIG. 12 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and processing components 96 for reprovisioning set forth herein. The processing components 96 can be implemented with use of one or more program 40 described in FIG. 10.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Forms of the term "based on" herein encompass relationships where an element is partially based on as well as relationships where an element is entirely based on. Methods, products and systems described as having a certain number of elements can be practiced with less than or greater than the certain number of elements. Furthermore, a device or structure that is configured in a certain way is configured in at least that way, but may also be configured in ways that are not listed.

It is contemplated that numerical values, as well as other values that are recited herein are modified by the term "about", whether expressly stated or inherently derived by the discussion of the present disclosure. As used herein, the term "about" defines the numerical boundaries of the modified values so as to include, but not be limited to, tolerances and values up to, and including the numerical value so modified. That is, numerical values can include the actual value that is expressly stated, as well as other values that are, or can be, the decimal, fractional, or other multiple of the actual value indicated, and/or described in the disclosure.

The corresponding structures, materials, acts, and equivalents of all means or step plus function elements in the claims below, if any, are intended to include any structure, material, or act for performing the function in combination with other claimed elements as specifically claimed. The description set forth herein has been presented for purposes of illustration and description, but is not intended to be exhaustive or limited to the form disclosed. Many modifications and variations will be apparent to those of ordinary skill in the art without departing from the scope and spirit of the disclosure. The embodiment was chosen and described in order to best explain the principles of one or more aspects set forth herein and the practical application, and to enable others of ordinary skill in the art to understand one or more aspects as described herein for various embodiments with various modifications as are suited to the particular use contemplated.

What is claimed is:

1. A computer implemented method comprising:
   iteratively obtaining utilization parameter values from first to Nth edge computing environments, training one or more predictive model by machine learning using parameter values of the utilization parameter values obtained by the iteratively obtaining, wherein the training includes training a first computing environment predictive model with use of parameter values of the utilization parameters obtained from the first computing environment by the iteratively obtaining, wherein the first computing environment predictive model is a machine learning model for predicting subsequent performance of the first edge computing environment;
   applying query data to the first computing environment predictive model to output a predicted utilization parameter value of the first edge computing environment at a subsequent time;
   inputting the predicted utilization parameter value and an updated service level agreement parameter value for the first edge computing environment to a second computing environment predictive model in order to output provisioning data, the second computing environment predictive model being another machine learning model; and
   providing an action decision to reprovision the first edge computing environment with use of the provisioning data;
   wherein the determining provisioning data for the first edge computing environment includes ascertaining adjusted sensor configuration provisioning data for the first edge computing environment, the ascertaining including querying a sensor resolution predictive model trained with machine learning training data to predict sensor resolution performance of a virtually reprovisioned instance of the first edge computing environment.

2. The computer implemented method of claim 1, wherein the utilization parameter values from the first to Nth edge computing environments include infrastructure utilization parameter values.

3. The computer implemented method of claim 1, wherein the utilization parameter values from the first to Nth edge computing environments include network utilization parameter values.

4. The computer implemented method of claim 1, wherein the utilization parameter values from the first to Nth edge computing environments include infrastructure utilization parameter values, and wherein the utilization parameter values from first to Nth edge computing environments include network utilization parameter values.

5. The computer implemented method of claim 1, wherein a majority of utilization parameter value training data for training the first predictive is obtained from the first edge computing environment.

6. The computer implemented method of claim 1, wherein the determining the provisioning data for the first edge computing environment in dependence on the predicted utilization parameter value includes querying a global computing environments predictive model, wherein the global computing environments predictive model has been trained with utilization parameter values obtained from the first through Nth computing environments.

7. The computer implemented method of claim 1, wherein the determining provisioning data for the first edge computing environment in dependence on the predicted utilization parameter value includes querying a global computing environments predictive model, wherein the global computing environments predictive model has been trained with utilization parameter values obtained from the first through Nth computing environments, and wherein the querying includes applying the predicted utilization parameter value of the first edge computing environment as query data to the global computing environments predictive model.

8. The computer implemented method of claim 1, wherein the determining provisioning data for the first edge computing environment includes testing candidate provisioning data for the first edge computing environment, wherein the testing the candidate provisioning data for the first edge computing environment includes performing simulation testing to simulate a certain condition applied to the first edge computing environment adjusted by the candidate provisioning data.

9. The computer implemented method of claim 1, wherein the determining provisioning data for the first edge computing environment includes testing candidate provisioning data, the candidate provisioning data for adjusting provisioning of the first edge computing environment, wherein the testing the candidate provisioning data for adjusting provisioning of the first edge computing environment includes performing simulation testing to simulate a certain condition applied to the first edge computing environment adjusted by the candidate provisioning data.

10. The computer implemented method of claim 1, wherein the iteratively obtaining utilization parameter values from first to Nth edge computing environments includes iteratively storing the utilization parameter values from first to Nth edge computing environments into a data repository defining a history repository, wherein the determining provisioning data for the first edge computing environment includes testing candidate provisioning data, the candidate provisioning data for adjusting provisioning of the first edge computing environment, wherein the testing the candidate provisioning data for adjusting provisioning of the first edge computing environment includes performing simulation testing to simulate a certain condition applied to a virtually reprovisioned instance of the first edge computing environment virtually reprovisioned by the candidate provisioning data, wherein the performing simulation testing includes examining data of the history repository for identification of the certain condition.

11. The computer implemented method of claim 1, wherein the iteratively obtaining utilization parameter values from first to Nth edge computing environments includes iteratively storing the utilization parameter values from first to Nth edge computing environments into a data repository defining a history repository, wherein the training one or more predictive model by machine learning using parameter values of the utilization parameter values obtained by the iteratively obtaining, includes training first through Nth computing environment predictive model with use of parameter values of the utilization parameters obtained, respectively, from the first through Nth computing environment by the iteratively obtaining, the first through Nth predictive models for predicting, respectively, subsequent performance of the respective first through Nth edge computing environment.

12. The computer implemented method of claim 1, wherein the iteratively obtaining utilization parameter values from first to Nth edge computing environments includes iteratively storing the utilization parameter values from first to Nth edge computing environments into a data repository defining a history repository, wherein the training one or more predictive model by machine learning using parameter values of the utilization parameter values obtained by the iteratively obtaining, includes training first through Nth computing environment predictive model with use of parameter values of the utilization parameters obtained, respectively, from the first through Nth computing environment by the iteratively obtaining, the first through Nth predictive models for predicting, respectively, subsequent performance of the respective first through Nth edge computing environment, wherein the determining provisioning data for the first edge computing environment includes testing candidate provisioning data, the candidate provisioning data for adjusting provisioning of the first edge computing environment, wherein the testing the candidate provisioning data for adjusting provisioning of the first edge computing environment includes performing simulation testing to simulate a certain condition applied to the first edge computing environment adjusted by the candidate provisioning data, wherein the performing simulation testing includes selecting a second predictive model for use in performing the simulation testing, the second predictive model being associated to a second edge computing environment of the first through Nth edge computing environments, the selecting being in dependence on a determining that the second computing environment has a threshold satisfying level of similarity with a virtually reprovisioned instance of the first edge computing environment virtually reprovisioned by the candidate provisioning data.

13. The computer implemented method of claim 1, wherein the determining provisioning data for the first edge computing environment includes testing candidate provisioning data, the candidate provisioning data for adjusting provisioning of the first edge computing environment, wherein the testing the candidate provisioning data for adjusting provisioning of the first edge computing environment includes performing simulation testing to simulate a certain condition applied to the first edge computing environment adjusted by the candidate provisioning data, wherein the performing simulation testing includes selecting a second predictive model for use in performing the simulation testing, the second predictive model being associated to a second edge computing environment of the first through Nth edge computing environments, the selecting being in dependence on a determining that the second computing environment has a threshold satisfying level of similarity with a virtually reprovisioned instance of the first edge computing environment virtually reprovisioned by the candidate provisioning data.

14. The computer implemented method of claim 1, wherein the determining provisioning data for the first edge computing environment includes testing candidate provisioning data, the candidate provisioning data for adjusting provisioning of the first edge computing environment, wherein the testing the candidate provisioning data for adjusting provisioning of the first edge computing environment includes performing simulation testing to simulate a certain condition applied to the first edge computing environment adjusted by the candidate provisioning data, wherein the performing simulation testing includes selecting a second predictive model for use in performing the simulation testing, the second predictive model being associated to a second edge computing environment of the first through Nth edge computing environments, the selecting being in dependence on a determining that the second computing environment has a threshold satisfying level of similarity with a virtually reprovisioned instance of the first edge computing environment virtually reprovisioned by the candidate provisioning data, wherein the method includes applying the candidate provisioning data as the provisioning data and implementing the action decision to reprovision the first edge computing environment using the provisioning data, wherein the method includes subsequent to implementation of the action decision, testing accuracy of the first predictive model in predicting performance of the first edge computing environment using holdout data, and upon determining that the first predictive model exhibits a threshold satisfying level of accuracy in predicting performance of the first edge computing environment, re-performing simulation testing to simulate the certain condition applied to the first edge computing environment, wherein the re-performing the simulation testing includes applying query data to the first predictive model.

15. A computer program product comprising:
   a computer readable storage medium readable by one or more processing circuit and storing instructions for execution by one or more processor for performing a method comprising:
   iteratively obtaining utilization parameter values from first to Nth edge computing environments, training one or more predictive model by machine learning using parameter values of the utilization parameter values obtained by the iteratively obtaining, wherein the training includes training a first computing environment predictive model with use of parameter values of the utilization parameters obtained from the first computing environment by the iteratively obtaining, wherein the first computing environment predictive model is a machine learning model for predicting subsequent performance of the first edge computing environment;
   applying query data to the first computing environment predictive model to output a predicted utilization parameter value of the first edge computing environment at a subsequent time;
   inputting the predicted utilization parameter value and an updated service level agreement parameter value for the first edge computing environment to a second computing environment predictive model in order to output provisioning data, the second computing environment predictive model being another machine learning model; and providing an action decision to reprovision the first edge computing environment with use of the provisioning data;

wherein the determining provisioning data for the first edge computing environment includes ascertaining adjusted sensor configuration provisioning data for the first edge computing environment, the ascertaining including querying a sensor resolution predictive model trained with machine learning training data to predict sensor resolution performance of a virtually reprovisioned instance of the first edge computing environment.

16. The computer program product of claim 15, wherein the utilization parameter values from first to Nth edge computing environments include infrastructure utilization parameter values.

17. The computer program product of claim 15, wherein the utilization parameter values from first to Nth edge computing environments include network utilization parameter values.

18. The computer program product of claim 15, wherein the utilization parameter values from first to Nth edge computing environments include infrastructure utilization parameter values, and wherein the utilization parameter values from first to Nth edge computing environments include network utilization parameter values.

19. A system comprising:
a memory;
at least one processor in communication with the memory; and
program instructions executable by one or more processor via the memory to perform a method comprising:
iteratively obtaining utilization parameter values from first to Nth edge computing environments, training one or more predictive model by machine learning using parameter values of the utilization parameter values obtained by the iteratively obtaining, wherein the training includes training a first computing environment predictive model with use of parameter values of the utilization parameters obtained from the first computing environment by the iteratively obtaining, wherein the first computing environment predictive model is a machine learning model for predicting subsequent performance of the first edge computing environment;

applying query data to the first computing environment predictive model to output a predicted utilization parameter value of the first edge computing environment at a subsequent time;

inputting the predicted utilization parameter value and an updated service level agreement parameter value for the first edge computing environment to a second computing environment predictive model in order to output provisioning data, the second computing environment predictive model being another machine learning model; and providing an action decision to reprovision the first edge computing environment with use of the provisioning data;

wherein the determining provisioning data for the first edge computing environment includes ascertaining adjusted sensor configuration provisioning data for the first edge computing environment, the ascertaining including querying a sensor resolution predictive model trained with machine learning training data to predict sensor resolution performance of a virtually reprovisioned instance of the first edge computing environment.

* * * * *